(12) United States Patent
Hirakata

(10) Patent No.: US 9,748,314 B2
(45) Date of Patent: Aug. 29, 2017

(54) LIGHT-EMITTING DEVICE, INFORMATION PROCESSING DEVICE, AND IMAGING DEVICE

(71) Applicant: Semiconductor Energy Laboratory Co., Ltd., Kanagawa-ken (JP)

(72) Inventor: Yoshiharu Hirakata, Kanagawa (JP)

(73) Assignee: Semiconductor Energy Laboratory Co., Ltd. (JP)

(*) Notice: Subject to any disclaimer, the term of this patent is extended or adjusted under 35 U.S.C. 154(b) by 12 days.

(21) Appl. No.: 15/018,115

(22) Filed: Feb. 8, 2016

(65) Prior Publication Data

US 2016/0155783 A1  Jun. 2, 2016

Related U.S. Application Data

(63) Continuation of application No. 14/487,715, filed on Sep. 16, 2014, now Pat. No. 9,263,504.

(30) Foreign Application Priority Data

Sep. 19, 2013  (JP) ................................. 2013-194056
Sep. 19, 2013  (JP) ................................. 2013-194059

(51) Int. Cl.
*H01L 21/08*  (2006.01)
*H01L 27/32*  (2006.01)
*H01L 51/52*  (2006.01)
*H01L 27/146* (2006.01)
*H05B 33/08*  (2006.01)

(52) U.S. Cl.
CPC .... *H01L 27/3234* (2013.01); *H01L 27/14625* (2013.01); *H01L 51/5275* (2013.01); *H05B 33/0896* (2013.01); *H01L 2251/5361* (2013.01)

(58) Field of Classification Search
CPC .... H01L 27/288; H01L 27/32; H01L 51/0032
See application file for complete search history.

(56) References Cited

U.S. PATENT DOCUMENTS

| | | | |
|---|---|---|---|
| 7,598,927 B2 | 10/2009 | Yamazaki et al. | |
| 8,319,714 B2 | 11/2012 | Kojima et al. | |
| 8,550,907 B2 | 10/2013 | Yamazaki et al. | |
| 8,791,878 B2 | 7/2014 | Yamazaki et al. | |
| 2005/0052348 A1* | 3/2005 | Yamazaki ............. | G02B 27/01 345/44 |
| 2011/0101880 A1 | 5/2011 | Ribarich | |
| 2014/0347555 A1 | 11/2014 | Hirakata et al. | |
| 2015/0003034 A1 | 1/2015 | Nakamura et al. | |
| 2015/0080051 A1 | 3/2015 | Yamazaki et al. | |

FOREIGN PATENT DOCUMENTS

JP  2009-130132 A  6/2009

* cited by examiner

*Primary Examiner* — Elias M Ullah
(74) *Attorney, Agent, or Firm* — Husch Blackwell LLP

(57) ABSTRACT

Provided is a light-emitting device and an information processing device which include a light-emitting element mounted on a housing and an optical component detachable from the housing. The optical component is capable of condensing light emitted from the light-emitting element. This structure allows a user to select the emission of diffused light and condensed light by attaching or detaching the optical component.

6 Claims, 24 Drawing Sheets

FIG. 1A1
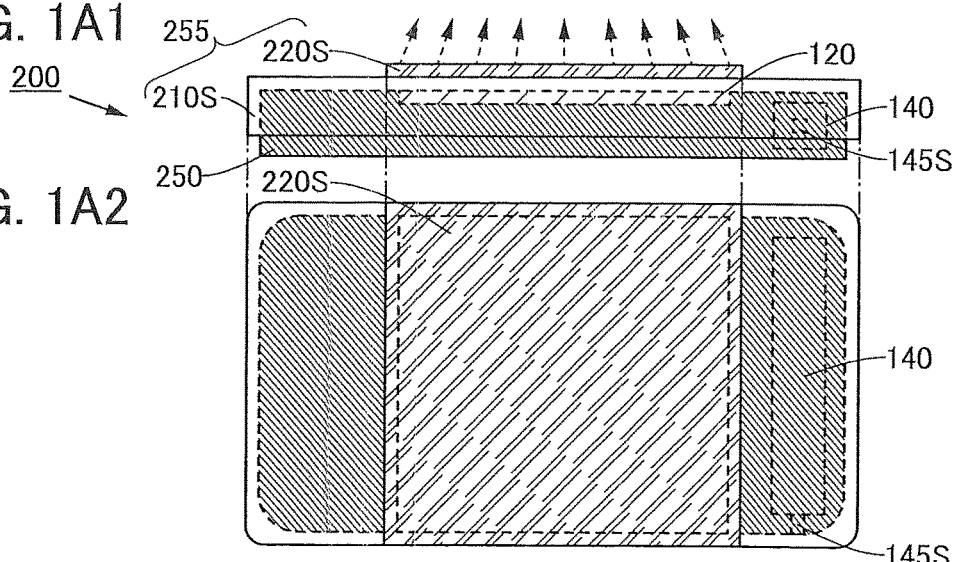
FIG. 1A2
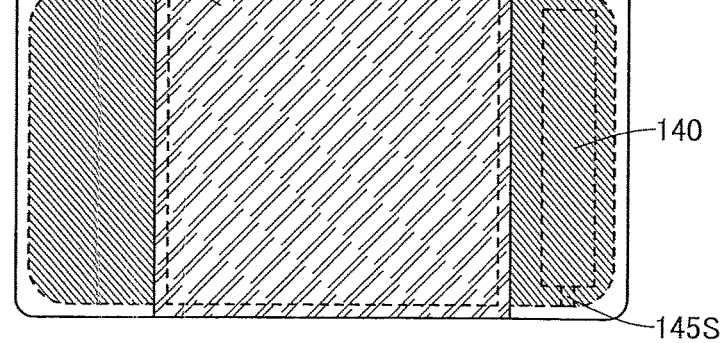
FIG. 1B1
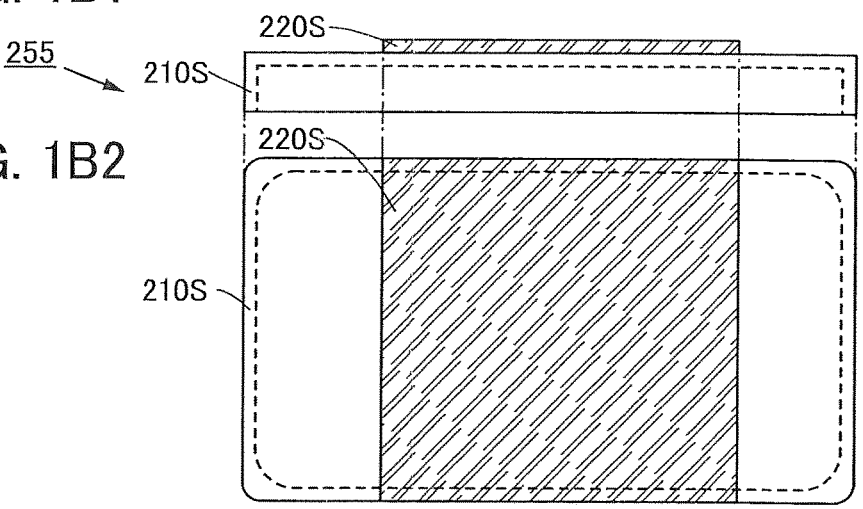
FIG. 1B2
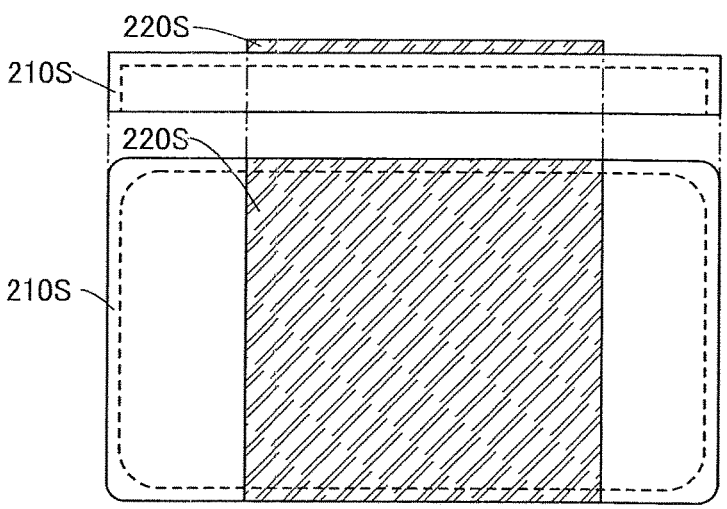
FIG. 1C1
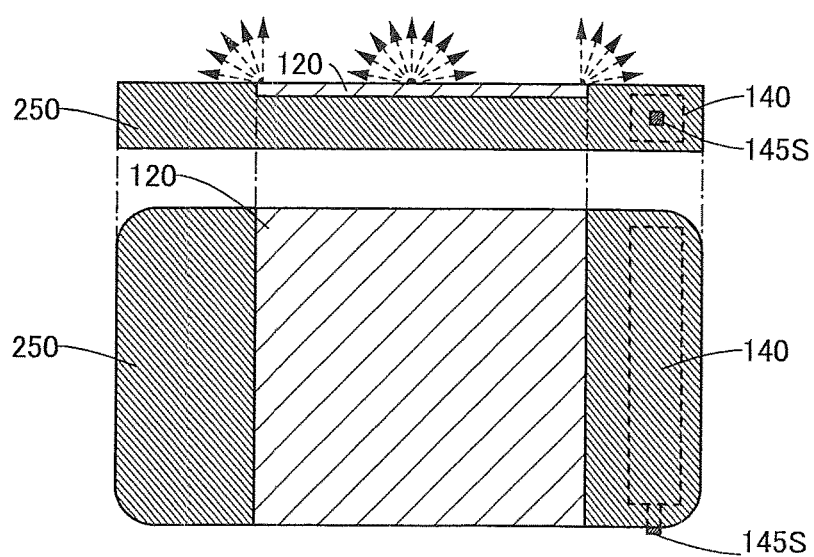
FIG. 1C2
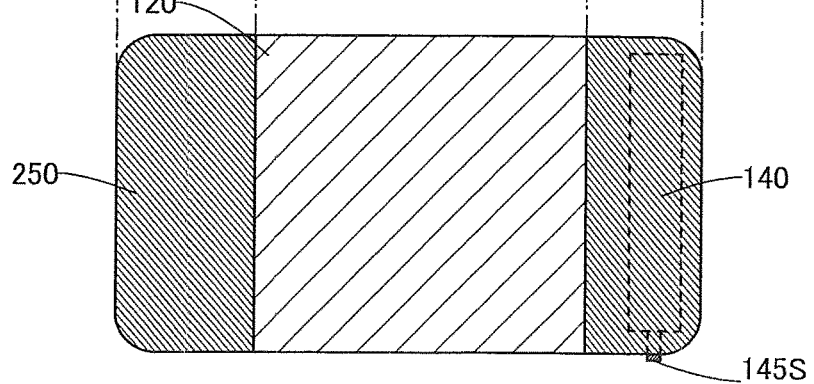

FIG. 4A1
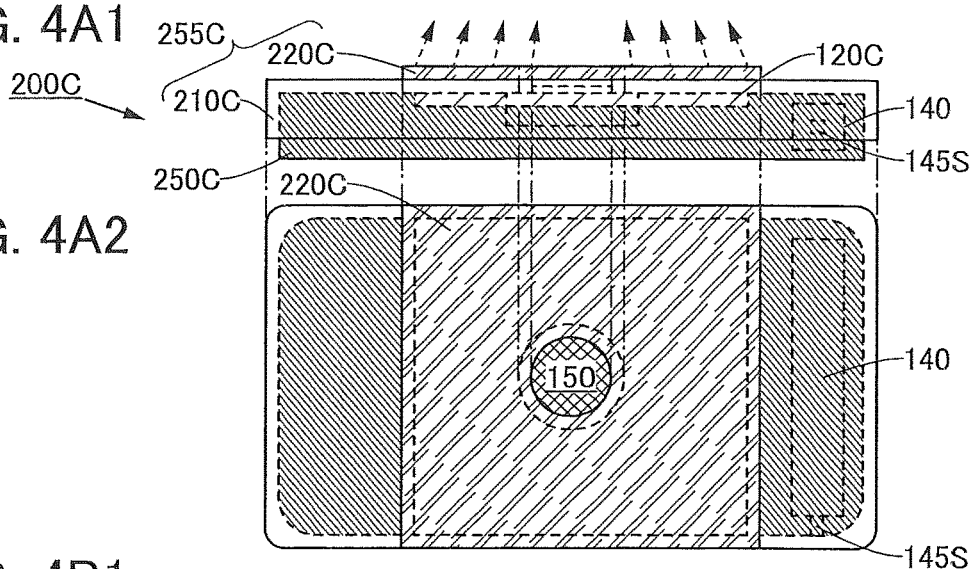
FIG. 4A2
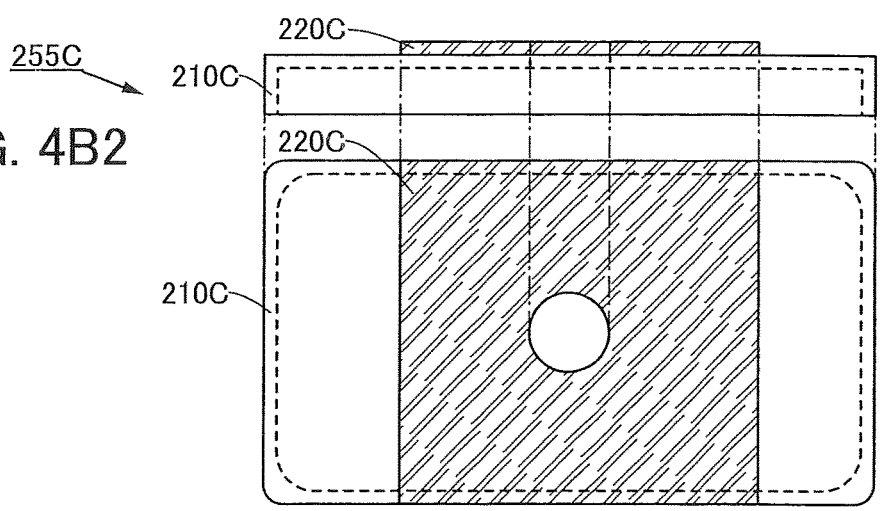
FIG. 4B1
FIG. 4B2
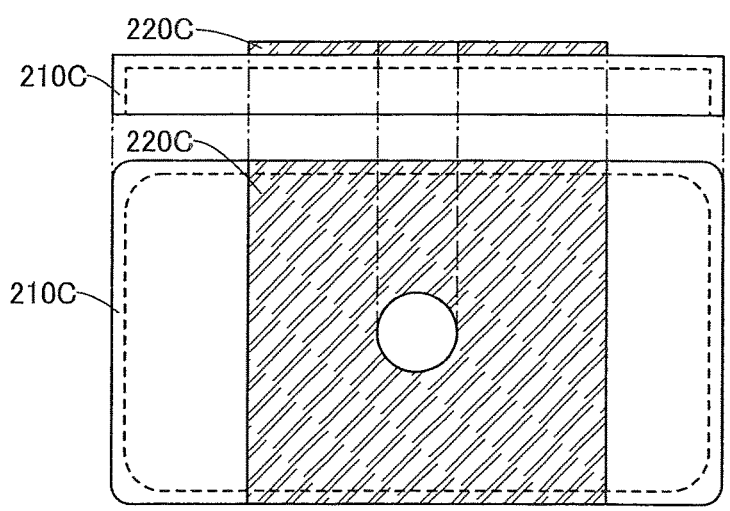
FIG. 4C1
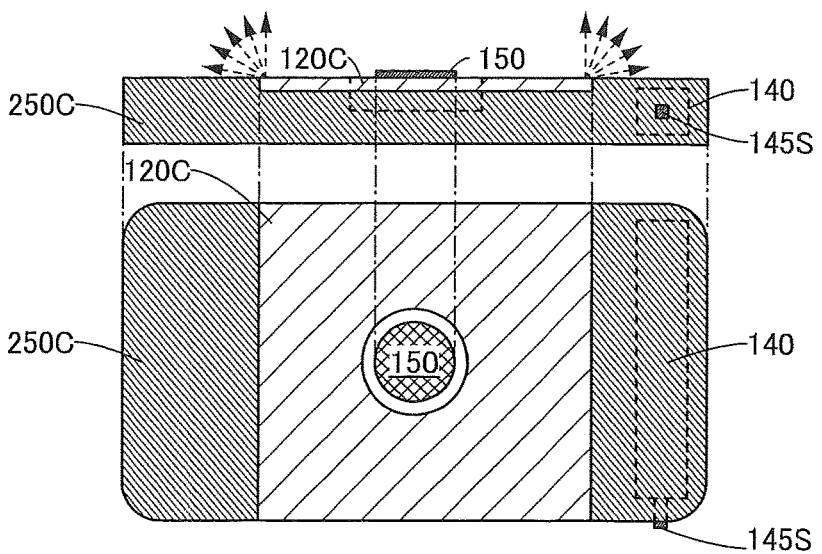
FIG. 4C2

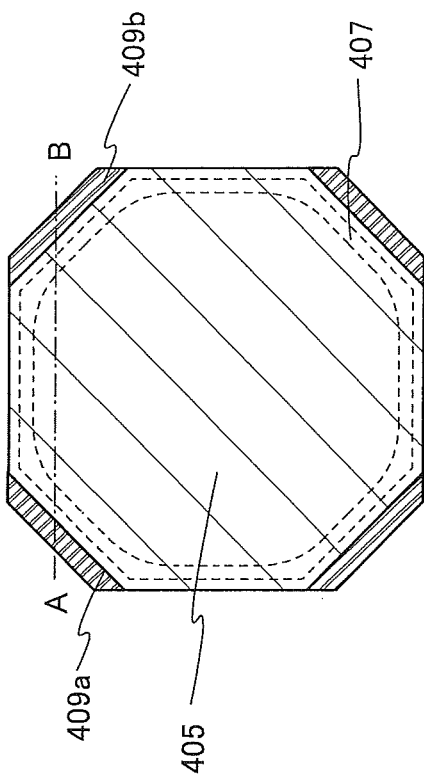
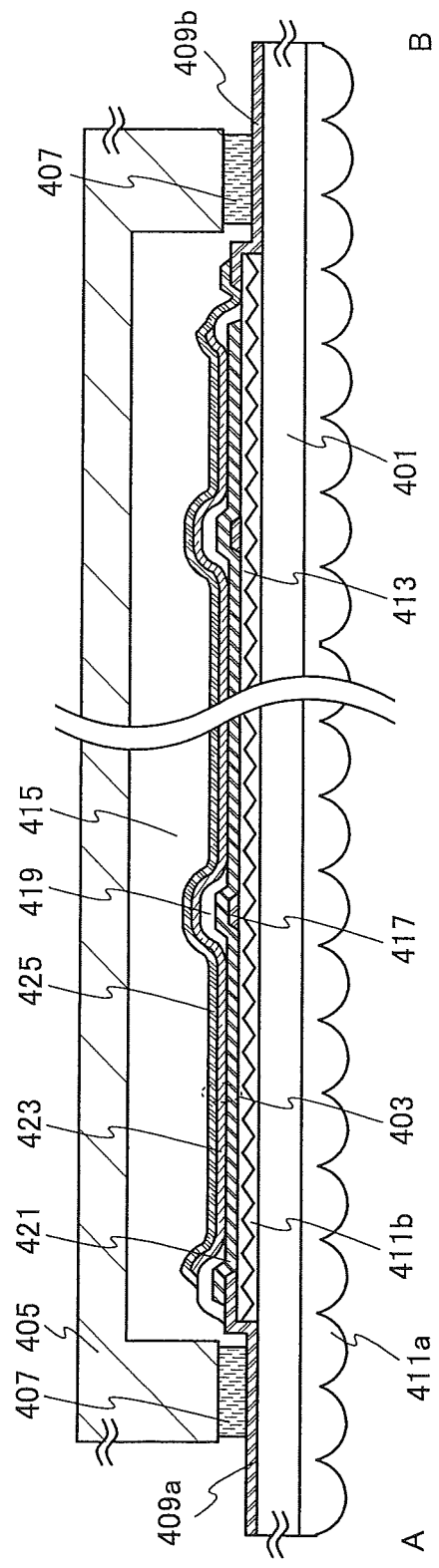
FIG. 6A
FIG. 6B

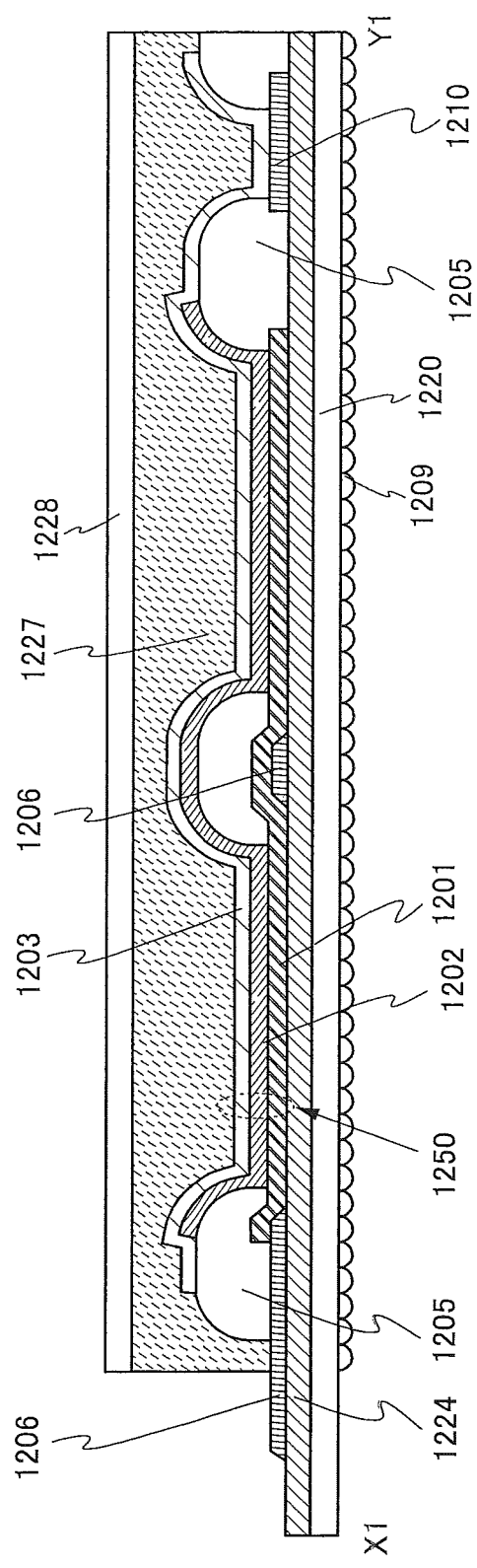
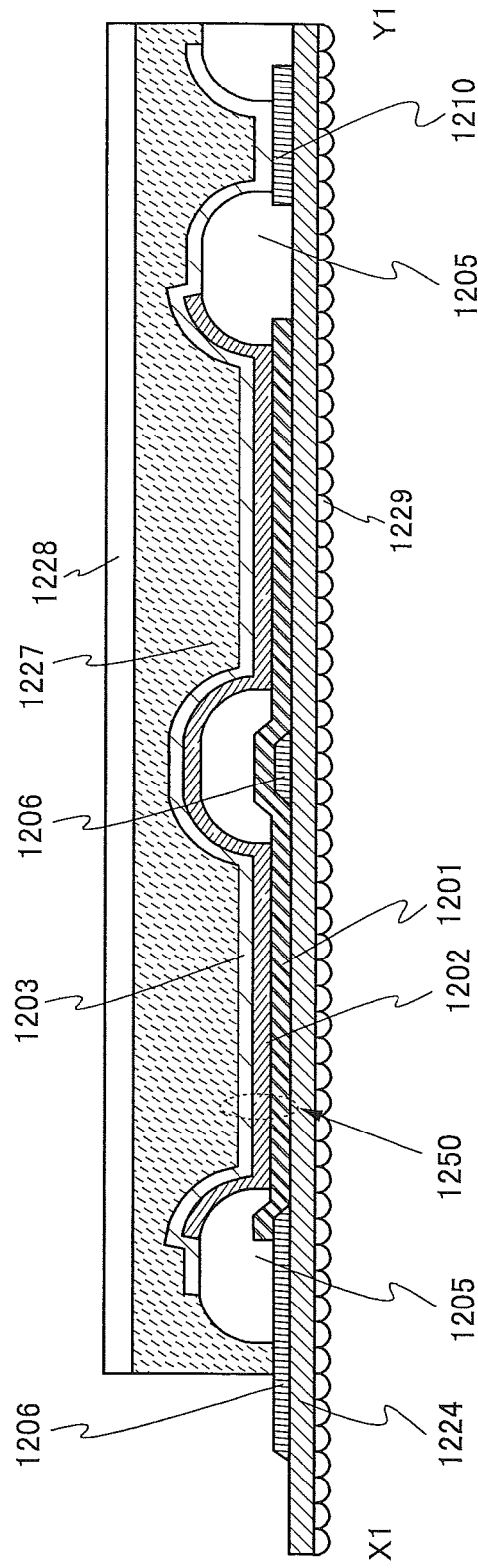

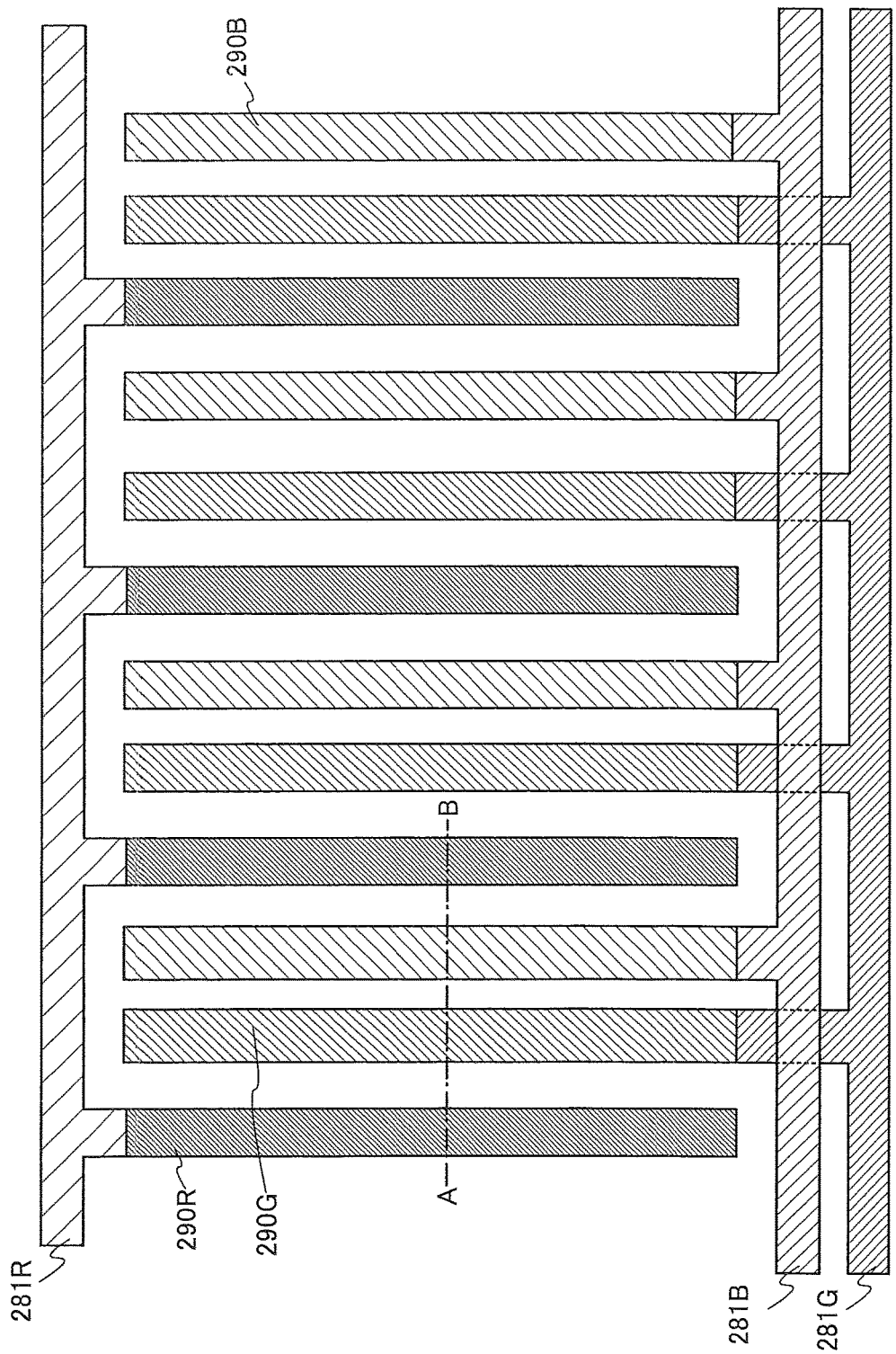

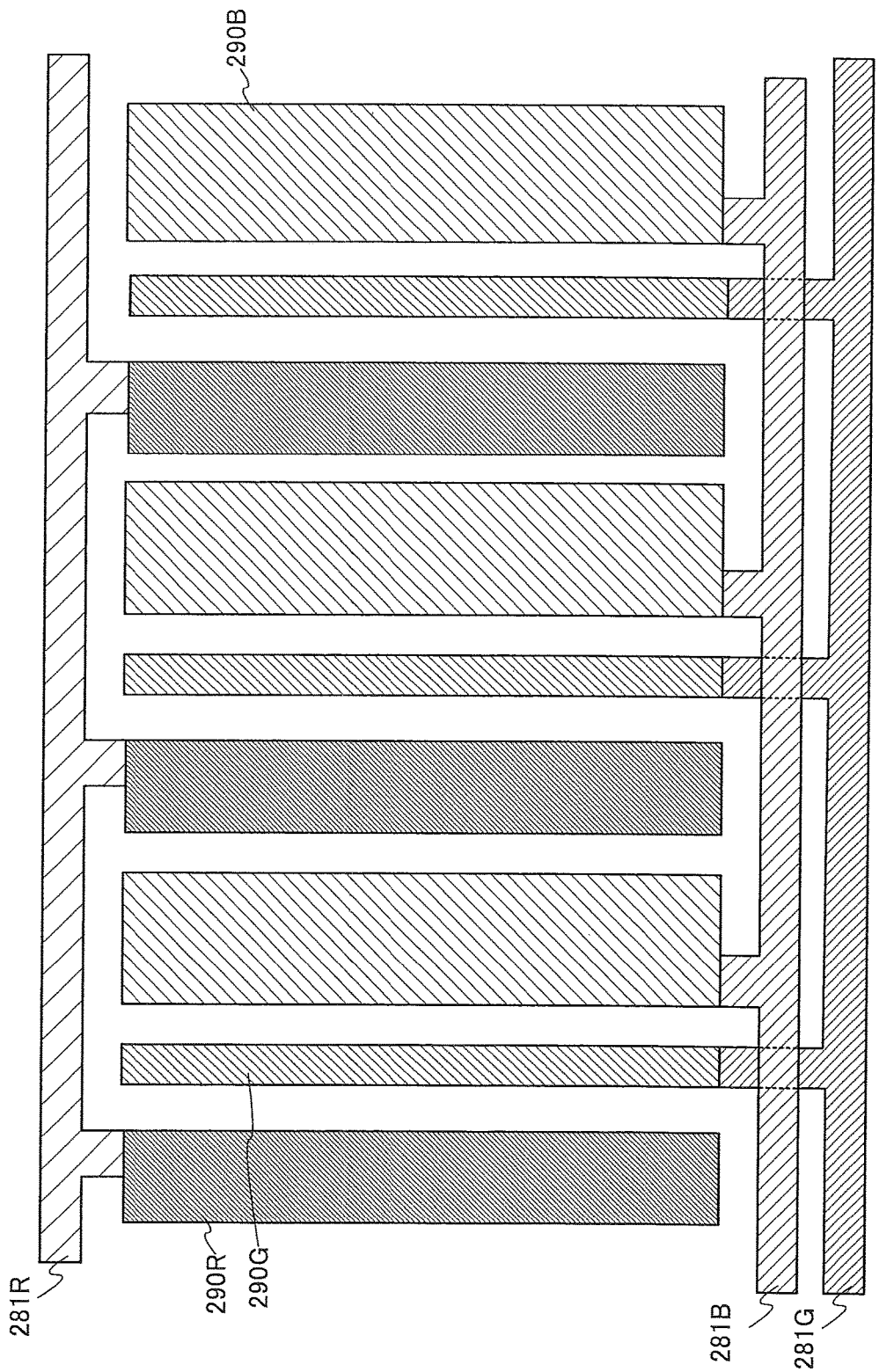

LIGHT-EMITTING DEVICE, INFORMATION PROCESSING DEVICE, AND IMAGING DEVICE

This application is a continuation of copending U.S. application Ser. No. 14/487,715, filed on Sep. 16, 2014 which is incorporated herein by reference.

BACKGROUND OF THE INVENTION

1. Field of the Invention

The present invention relates to, for example, a semiconductor device, a display device, a light-emitting device, a security device, an imaging device, a driving method thereof, or a manufacturing method thereof. Particularly, the present invention relates to, for example, a light-emitting device or an information processing device.

2. Description of the Related Art

The social infrastructures relating to means for transmitting information have advanced. This has made it possible to acquire, process, and send out many pieces and various kinds of information with the use of an information processing device not only at home or office but also at other visiting places.

In such a situation, portable information processing devices are under active development.

An organic EL element can be formed into a film shape; thus, a large-area element can easily be formed. Therefore, the organic EL element has a high utility value as a surface light source that can be applied to lighting or the like.

For example, Patent Document 1 discloses a lighting device including an organic EL element.

REFERENCE

Patent Document

[Patent Document 1] Japanese Published Patent Application No. 2009-130132

SUMMARY OF THE INVENTION

An object of one embodiment of the present invention is to provide a novel light-emitting device. Another object of one embodiment of the present invention is to provide a novel information processing device. Another object of one embodiment of the present invention is to provide a light-emitting device including a light-emitting element, a housing, and an optical component attachable to and detachable from the housing. Another object of one embodiment of the present invention is to provide a light-emitting device capable of emitting condensed light in a state where an optical component is attached and capable of emitting diffused light in a state where the optical component is detached. Another object of one embodiment of the present invention is to provide a light-emitting device capable of selecting the intensity and the direction of light emission. Another object of one embodiment of the present invention is to provide a light-emitting device capable of selecting the direction of light emission. Another object of one embodiment of the present invention is to provide a light-emitting device capable of driving a light-emitting element in a state where an optical component is detached, using current whose amount is different from that of current for driving the light-emitting element in a state where the optical component is attached.

Another object of one embodiment of the present invention is to provide a novel imaging device. Another object of one embodiment of the present invention is to provide a light-emitting device capable of emitting pulsed light having directivity. Another object of one embodiment of the present invention is to provide a light-emitting device capable of emitting pulsed light having directivity and having different colors. Another object of one embodiment of the present invention is to provide a light-emitting device capable of emitting pulsed light having directivity and having different colors at an intensity in accordance with a sensor signal supplied from a sensor for sensing an environment or the like. Another object of one embodiment of the present invention is to provide an imaging device or the like capable of emitting pulsed light having directivity and capable of performing imaging in an emission direction of the pulsed light.

Note that the descriptions of these objects do not disturb the existence of other objects. In one embodiment of the present invention, there is no need to achieve all the objects. Other objects will be apparent from and can be derived from the description of the specification, the drawings, the claims, and the like.

One embodiment of the present invention is a light-emitting device including a light-emitting element, a housing for supporting the light-emitting element, and an optical component attachable to and detachable from the housing. The light-emitting element includes a first electrode, a second electrode overlapping with the first electrode, and a layer containing a light-emitting organic compound, and is provided between the first electrode and the second electrode. The optical component includes an attaching member for engaging with the housing, and an optical sheet for condensing light emitted from the light-emitting element while being attached to the housing using the attaching member.

One embodiment of the present invention is the light-emitting device in which the optical sheet includes a planar prism, a Fresnel lens, or a fly-eye lens.

With this structure, condensed light can be emitted in a state where the optical component is attached, and diffused light can be emitted in a state where the optical component is detached. Consequently, a novel light-emitting device capable of selecting the direction of light emission can be provided. Furthermore, a novel lighting device, a novel information processing device, or the like can be provided. Note that the description of these effects does not disturb the existence of other effects. One embodiment of the present invention does not necessarily achieve all the objects listed above. Other effects will be apparent from and can be derived from the description of the specification, the drawings, the claims, and the like.

One embodiment of the present invention is the light-emitting devices further including a switching circuit configured to be supplied with constant current and a control pulse signal and configured to supply a constant current pulse, where the light-emitting element is configured to be supplied with the constant current pulse.

One embodiment of the present invention is the light-emitting devices further including a sensor circuit configured to sense a state of attachment or detachment of the optical component and supply an attachment/detachment signal which includes the information on whether the optical component is attached or detached, and a constant current supply configured to be supplied with the attachment/detachment signal and configured to supply constant current whose amount is determined depending on the attachment/ detachment signal, where the light-emitting element is configured to be supplied with the constant current.

The light-emitting device of one embodiment of the present invention includes the light-emitting element, the housing, the optical component attachable to and detachable from the housing, and the constant current supply that supplies current whose amount is controlled depending on the state of attachment and detachment of the optical component. With this structure, the light-emitting element in a state where the optical component is detached can be driven using current whose amount is different from that of current for driving the light-emitting element in a state where the optical component is attached, so that diffused light can be emitted. Consequently, it is possible to select the intensity and the direction of light emission.

One embodiment of the present invention is an information processing device including a light-emitting element, an imaging unit provided so that imaging is performed in an emission direction of light from the light-emitting element, a housing for supporting the light-emitting element and the imaging unit, and an optical component attachable to and detachable from the housing. The light-emitting element includes a first electrode, a second electrode overlapping with the first electrode, and a layer containing a light-emitting organic compound, between the first electrode and the second electrode. The optical component includes an attaching member for engaging with the housing and an optical sheet for condensing light emitted from the light-emitting element.

One embodiment of the present invention is the information processing device in which the optical sheet includes a planar prism, a Fresnel lens, or a fly-eye lens.

With this structure, imaging can be performed while condensed light is emitted in a state where the optical component is attached and diffused light is emitted in a state where the optical component is detached. Consequently, it is possible to select the direction of light emission.

One embodiment of the present invention is the information processing devices including a switching circuit configured to be supplied with constant current and a control pulse signal and configured to supply a constant current pulse, where the light-emitting element is configured to be supplied with the constant current pulse.

One embodiment of the present invention is the information processing devices including a sensor circuit configured to sense a state of attachment or detachment of the optical component and configured to supply an attachment/detachment signal, and a constant current supply configured to be supplied with the attachment/detachment signal and configured to supply constant current whose amount is determined depending on the attachment/detachment signal, where the light-emitting element is configured to be supplied with the constant current.

With this structure, the light-emitting element in a state where the optical component is detached can be driven using current whose amount is different from that of current for driving the light-emitting element in a state where the optical component is attached, so that diffused light can be emitted. Consequently, it is possible to select the intensity and the direction of light emission.

One embodiment of the present invention is a light-emitting device including a start switch circuit configured to supply a start signal, a microcontroller configured to be supplied with the start signal and configured to supply a control pulse signal, a switching circuit configured to be supplied with the control pulse signal and constant current and configured to supply a constant current pulse, a constant current supply configured to supply the constant current, and a light-emitting module configured to be supplied with the constant current pulse and configured to emit pulsed light. Note that in this specification, an object including at least one light-emitting module over a substrate is referred to as a light-emitting panel.

The light-emitting module includes a light-emitting element and a microresonator that sandwiches the light-emitting element and emits light from one side of the microresonator. The light-emitting element includes a lower electrode, an upper electrode overlapping with the lower electrode, and a layer containing a light-emitting organic compound, between the lower electrode and the upper electrode. The microresonator includes a reflective film and a semi-transmissive and semi-reflective film overlapping with the reflective film.

With this structure, pulsed light having directivity can be emitted from the light-emitting module.

One embodiment of the present invention includes a start switch circuit configured to supply a start signal, a microcontroller configured to be supplied with the start signal and configured to supply a control pulse signal, a first switching circuit configured to be supplied with the control pulse signal and first constant current and configured to supply a first constant current pulse, a second switching circuit configured to be supplied with the control pulse signal and second constant current and configured to supply a second constant current pulse, a first constant current supply configured to supply the first constant current, a first light-emitting module configured to be supplied with the first constant current pulse, a second constant current supply configured to supply the second constant current, and a second light-emitting module configured to be supplied with the second constant current pulse.

Furthermore, the second light-emitting module emits light of color different from color of light emitted from the first light-emitting module. The first light-emitting module and the second light-emitting module each include a light-emitting element and a microresonator for sandwiching the light-emitting element and emitting light from one side of the microresonator. The light-emitting element includes a lower electrode, an upper electrode overlapping with the lower electrode, and a layer containing a light-emitting organic compound, between the lower electrode and the upper electrode. The microresonator includes a reflective film and a semi-transmissive and semi-reflective film overlapping with the reflective film.

With this structure, pulsed light having different colors and having directivity can be emitted.

One embodiment of the present invention is the above-described light-emitting device further including a control circuit which includes a sensor and is configured to supply a sensor signal and to supply a first control signal and a second control signal in accordance with the sensor signal, where the first constant current supply is configured to be supplied with the first control signal and configured to control the amount of the first constant current in accordance with the first control signal, and where the second constant current supply is configured to be supplied with the second control signal and configured to control the amount of the second constant current in accordance with the second control signal.

With this structure, pulsed light having directivity and having different colors can be emitted at an intensity in accordance with the sensor signal supplied from the sensor that senses an environment or the like.

One embodiment of the present invention is an imaging device including an imaging unit configured to be supplied with a shutter signal and configured to perform imaging in an emission direction of the pulsed light and the above-described light-emitting device configured to supply the shutter signal. The light-emitting device includes a microcontroller configured to supply the shutter signal.

With this structure, pulsed light having directivity can be emitted, and imaging in an emission direction of the pulsed light can be performed.

Note that in this specification, an "EL layer" refers to a layer provided between a pair of electrodes in a light-emitting element. Thus, a light-emitting layer containing a light-emitting organic compound interposed between electrodes is an embodiment of the EL layer.

According to one embodiment of the present invention, a novel light-emitting device can be provided. Furthermore, a novel information processing device can be provided. Note that the descriptions of these effects do not disturb the existence of other effects. One embodiment of the present invention does not necessarily achieve all the effects listed above. Other effects will be apparent from and can be derived from the description of the specification, the drawings, the claims, and the like.

BRIEF DESCRIPTION OF THE DRAWINGS

FIGS. 1A1, 1A2, 1B1, 1B2, 1C1, and 1C2 illustrate a light-emitting device according to an embodiment.

FIG. 2 is a block diagram illustrating a structure of a light-emitting device according to an embodiment.

FIGS. 4A1, 4A2, 4B1, 4B2, 4C1, and 4C2 illustrate an information processing device according to an embodiment.

FIGS. 6A and 6B illustrate a light-emitting panel.

FIGS. 8A and 8B each illustrate a light-emitting panel.

FIG. 19 is a top view illustrating a structure of a light-emitting panel of a light-emitting device according to an embodiment.

FIG. 20 is a top view illustrating a structure of a light-emitting panel of a light-emitting device according to an embodiment.

DETAILED DESCRIPTION OF THE INVENTION

Figure 2:
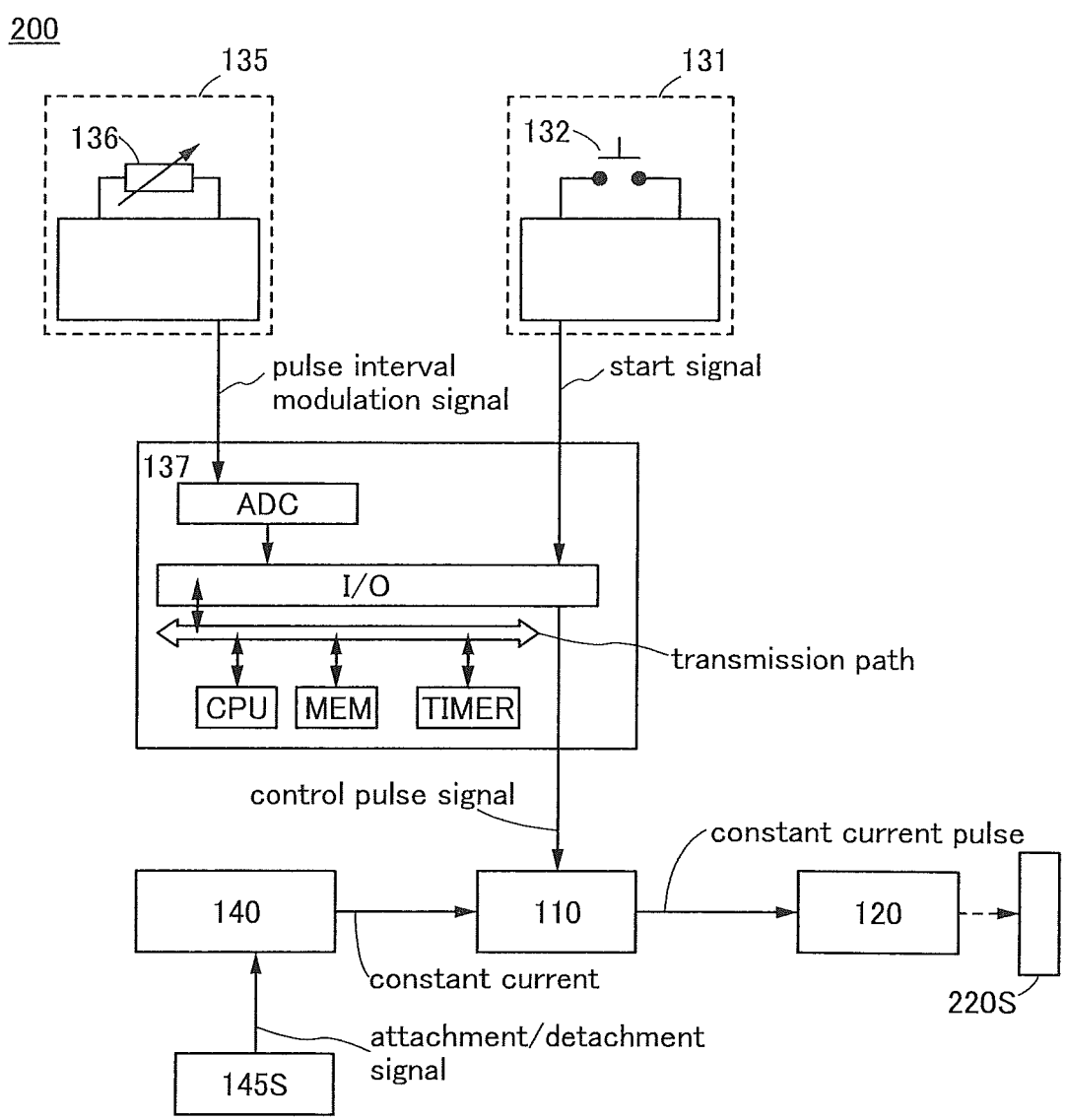

A light-emitting device of one embodiment of the present invention includes a light-emitting element, a housing, and an optical component attachable to and detachable from the housing. With this structure, condensed light can be emitted in a state where the optical component is attached, and diffused light can be emitted in a state where the optical component is detached. Consequently, a novel light-emitting device capable of selecting the direction of light emission can be provided.

A light-emitting device of one embodiment of the present invention includes a microcontroller configured to supply a control pulse signal, a switching circuit configured to be supplied with the control pulse signal and configured to supply a constant current pulse, and a light-emitting module configured to be supplied with the constant current pulse. The light-emitting module includes a microresonator and a light-emitting element sandwiched by the microresonator.

With this structure, pulsed light having directivity can be emitted from the light-emitting module.

Embodiments will be described in detail with reference to drawings. Note that the present invention is not limited to the description below, and it is easily understood by those skilled in the art that various changes and modifications can be made without departing from the spirit and scope of the present invention. Accordingly, the present invention should not be interpreted as being limited to the content of the embodiments below. Note that in the structures of the invention described below, the same portions or portions having similar functions are denoted by the same reference numerals in different drawings, and description of such portions is not repeated.

Embodiment 1

In this embodiment, a structure of a light-emitting device of one embodiment of the present invention is described with reference to FIGS. 1A1, 1A2, 1B1, 1B2, 1C1, and 1C2.

FIGS. 1A1, 1A2, 1B1, 1B2, 1C1, and 1C2 illustrate a structure of a light-emitting device 200 of one embodiment of the present invention.

FIGS. 1A1 and 1A2 are a side view and a top view, respectively, of the light-emitting device 200 of one embodiment of the present invention.

FIGS. 1B1 and 1B2 are a side view and a top view, respectively, of an optical component 255 of the light-emitting device 200 of one embodiment of the present invention.

FIGS. 1C1 and 1C2 are a side view and a top view, respectively, of a housing 250 and a light-emitting element 120 of the light-emitting device 200 of one embodiment of the present invention.

FIG. 2 is a block diagram illustrating a structure of the light-emitting device of one embodiment of the present invention.

Figure 3A:
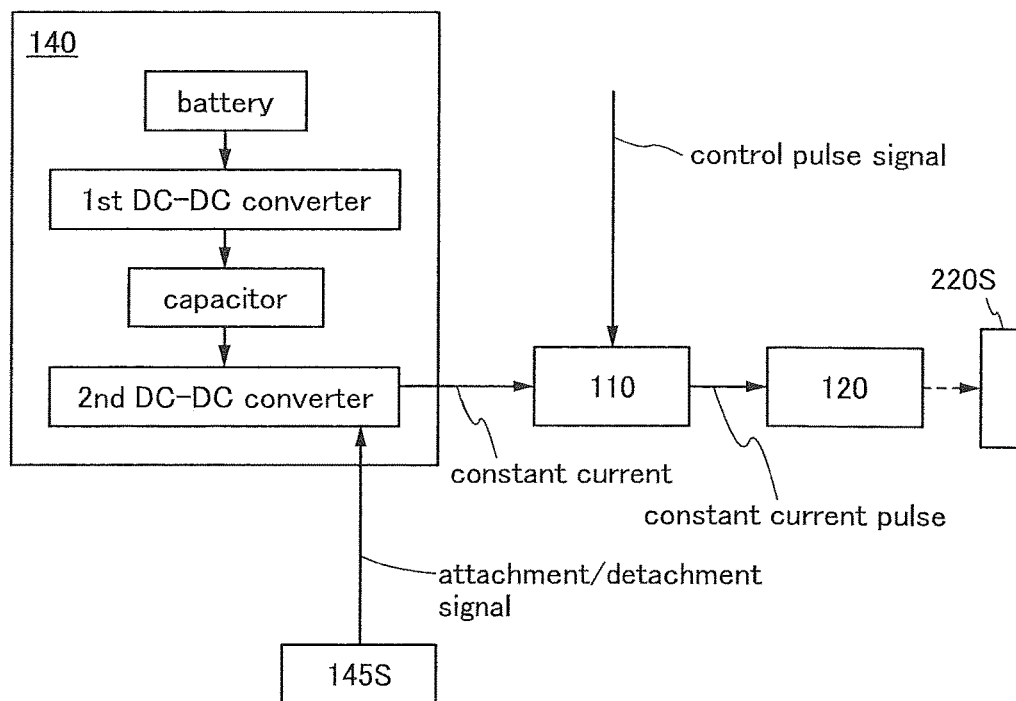
FIG. 3A illustrates a structure for generating a constant current pulse according to an embodiment.
Figure 3B:
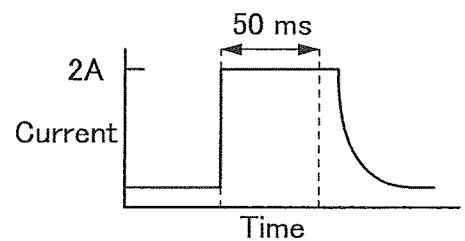
FIGS. 3B and 3C illustrate the constant current pulse.
Figure 3C:
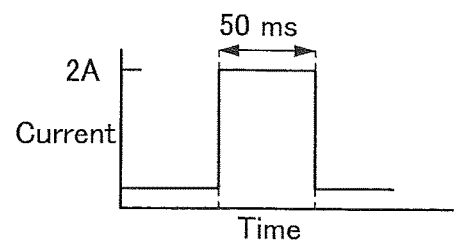

FIG. 3A illustrates a structure of generating a constant current pulse which is supplied to the light-emitting element 120 of the light-emitting device 200. FIGS. 3B and 3C illustrate the constant current pulse.

The light-emitting device 200 described in this embodiment includes the light-emitting element 120, the housing 250 which supports the light-emitting element 120, and the optical component 255 which can be attached to and detached from the housing 250 (see FIGS. 1A1, 1A2, 1B1, 1B2, 1C1, and 1C2).

The light-emitting element 120 includes a first electrode, a second electrode overlapping with the first electrode, and a layer containing a light-emitting organic compound which is provided between the first electrode and the second electrode. The optical component 255 includes an attaching member 210S and an optical sheet 220S. The attaching member 210S engages with the housing 250. The optical sheet 220S attached to the housing 250 using the attaching member 210S condenses light emitted from the light-emitting element 120.

The optical sheet 220S includes a planar prism, a Fresnel lens, or a fly-eye lens.

The light-emitting device 200 of one embodiment of the present invention can emit condensed light in a state where the optical component 255 is attached, and can emit diffused light in a state where the optical component 255 is detached. Consequently, a novel light-emitting device capable of selecting the direction of light emission can be provided.

The light-emitting device 200 described in this embodiment includes a sensor circuit 145S that senses a state of attachment or detachment of the optical component 255 and supplies an attachment/detachment signal, and a constant current supply 140 that is supplied with the attachment/detachment signal and supplies constant current having a predetermined amount in accordance with the attachment/detachment signal. The light-emitting element 120 is supplied with constant current having a predetermined amount in accordance with the attachment/detachment signal (see FIG. 2).

The light-emitting device 200 described in this embodiment can emit diffused light by driving the light-emitting element 120 in a state where the optical component 255 is detached, using current whose amount is different from that of current for driving the light-emitting element 120 in a state where the optical component 255 is attached. Consequently, it is possible to select the intensity and the direction of light emission.

The light-emitting device 200 is provided with a switch 132 and a start switch circuit 131 that includes the switch 132 and supplies a start signal when the switch 132 is operated.

The light-emitting device 200 includes a microcontroller 137 that is supplied with the start signal and supplies a control pulse signal, a switching circuit 110 that is supplied with the control pulse signal and the constant current and supplies the constant current pulse, the constant current supply 140 that supplies the constant current, and the light-emitting element 120 that is supplied with the constant current pulse and emits pulsed light to the outside of the housing 250.

<Light-Emitting Device>

Components of the light-emitting device 200 are described below.

<<Light-Emitting Element>>

A single light-emitting element 120 or a plurality of light-emitting elements 120 may be used. A light-emitting panel including one support substrate provided with a plurality of light-emitting elements can be used.

A plurality of light-emitting elements may be used, and the light-emitting elements may emit light of different colors.

Constant current circuits may be provided in accordance with emission colors of the light-emitting elements that emit light of different colors to independently control the amount of current to be supplied to the light-emitting elements, which makes color and color temperature of light emission variable.

A flexible light-emitting panel including a support substrate using a flexible material can be placed along the housing 250 having a curved surface. In that case, the light-emitting panel can be placed regardless of the design of the housing 250.

An organic EL element can be used for the light-emitting element 120.

The intensity of light that is emitted from the organic EL element has almost uniform (Lambertian) distribution in any observation direction. When the planar organic EL element is used for the light-emitting element 120, the light-emitting element 120 can irradiate light with comparatively uniform intensity (or diffused light) on a surface of an object. Thus, a shadow is not sharply produced.

Note that a structure of the light-emitting panel including the organic EL element is described in detail in Embodiment 3, and a structure of the organic EL element is described in detail in Embodiment 4.

The total area of a light-emitting portion of the light-emitting panel including the organic EL element is, for example, greater than or equal to 0.5 $cm^2$ and less than or equal to 1 $m^2$, preferably greater than or equal to 5 $cm^2$ and less than or equal to 200 $cm^2$, more preferably greater than or equal to 15 $cm^2$ and less than or equal to 100 $cm^2$. Note that a light-emitting portion having a large area can increase the total amount of light emitted in a pulsed manner.

In the light-emitting panel including the organic EL element, the density of current flowing in the light-emitting element in an emission state is greater than or equal to 10 $mA/cm^2$ and less than or equal to 2000 $mA/cm^2$, for example. Note that by reducing the current density, generation of heat in the light-emitting element due to emission of pulsed light can be suppressed.

<<Housing>>

The housing 250 supports the light-emitting element 120. An outer periphery of the light-emitting element 120 may be supported by the housing 250; alternatively, part of the housing 250 may have a light-transmitting property and the light-emitting element 120 may be installed in the housing 250.

The housing 250 can be formed using glass, resin, metal, ceramics, or the like.

<<Optical Component>>

The optical component 255 can be attached to and detached from an outer surface of the housing 250. The optical component 255 includes the attaching member 210S engaging with the housing 250 and the optical sheet 220S.

The optical component 255 may be obtained by integrally forming the attaching member 210S and the optical sheet 220S.

<<Attaching Member>>

The attaching member 210S engages with the housing 250 so that light emitted from the light-emitting element 120 enters the optical sheet 220S.

For example, a structure including a depressed portion having a size that enables engagement with the housing 250 can be used for the attaching member 210S. In this case, a top surface and a part of side surfaces of the housing 250 are covered by the attaching member 210S.

An elastic body such as resin or metal can be used as a material for the attaching member 210S, for example. Furthermore, a magnet or an adhesive may be used for the attaching member 210S.

<<Optical Sheet>>

The optical sheet 220S includes an optical element having a planar shape, a plate-like shape, or a film-like shape. Specifically, the optical sheet 220S includes a planar prism, a Fresnel lens, a fly-eye lens, or the like.

The optical sheet 220S provides bright illumination in a given direction by condensing light having comparatively uniform intensity (or diffused light) emitted from the planar organic EL element, for example.

For example, a film, a thin plate, or the like having minute unevenness on its surface can be used for the optical sheet 220S. Thus, the thickness of the optical element can be limited within the range from several tens of micrometers to several millimeters, for example. Furthermore, the weight thereof can be limited to several grams, for example. As a result, the optical component 255 can have high portability.

The optical sheet 220S such as a film or a thin plate having minute unevenness on its surface can be formed by any of a variety of methods such as a nanoimprinting method, an embossing method, a printing method, and a photolithography method.

The optical sheet 220S can be formed using a material such as resin or glass having a light-transmitting property.

<<Switching Circuit>>

The switching circuit 110 supplies the constant current pulse to the light-emitting element 120 while being supplied with the constant current and the control pulse signal (FIG. 2).

For example, a power transistor can be used for the switching circuit 110. Specifically, the switching circuit 110 can be configured such that the control pulse signal is supplied to a gate of the power transistor, the constant current is supplied to a first electrode of the power transistor, and the light-emitting element 120 is electrically connected to a second electrode of the power transistor. For example, a current of 2 A can be supplied to the light-emitting element 120 for 50 milliseconds.

<<Constant Current Supply>>

The constant current supply 140 includes a battery for supplying a first voltage, a first DC-DC converter that is supplied with the first voltage and supplies a second voltage higher than the first voltage, a capacitor that is supplied with the second voltage and supplies electric charge, and a second DC-DC converter that can be supplied with electric charge and supply the constant current (see FIG. 3A). The second DC-DC converter is supplied with the attachment/detachment signal, whereby the amount of current supplied by the constant current supply 140 can be controlled.

The first DC-DC converter steps up the voltage (the first voltage) of the battery and supplies the second voltage.

An example of a change over time of the current supplied by the constant current supply 140 is illustrated in FIG. 3B.

With this structure, the second DC-DC converter can supply the constant current while the capacitor supplies the electric charge to the second DC-DC converter. Note that when the electric charge stored in the capacitor is less than a predetermined level, the second DC-DC converter cannot supply the constant current.

The constant current supply 140 can supply the constant current for a period at least longer than the width of the control pulse signal (e.g., 50 milliseconds) supplied by the microcontroller 137.

When the current flows in the switching circuit 110, the electric charge stored in the capacitor is consumed; eventually, it becomes impossible for the constant current supply 140 to supply the constant current. As a result, a current that is not a rectangular wave flows in the light-emitting element 120, whereby the light-emitting element 120 emits light at luminance lower than predetermined luminance.

When light is emitted at luminance lower than predetermined luminance, unnecessary power is consumed.

Before the constant current supply 140 is unable to continue the supply of the constant current, the switching circuit 110 stops current supply. Thus, consumption of unnecessary power can be reduced. Note that an example of the current supplied by the switching circuit 110 is illustrated in FIG. 3C.

<<Microcontroller>>

The microcontroller 137 includes an arithmetic unit CPU, a timer unit TIMER, an analog-to-digital converter ADC, an input/output unit I/O, a memory unit MEM, a transmission path through which a data signal is transmitted, and the like.

The input/output unit I/O can be supplied with the start signal and the pulse interval modulation signal and can supply the control pulse signal.

The analog-to-digital converter ADC converts an analog signal to a digital signal. For example, the analog-to-digital converter ADC converts the supplied pulse interval modulation signal to a digital signal and supplies the digital signal.

The arithmetic unit CPU processes supplied data in accordance with a program stored in the memory unit MEM, and supplies the processed data.

The timer unit TIMER can measure predetermined time in accordance with an instruction to supply the control pulse signal after a lapse of the predetermined time or to supply the control pulse signal every predetermined time.

The timer unit TIMER can measure time for determining a width (half width) of the control pulse signal. For example, a predetermined width of the control pulse signal can be greater than or equal to 1 millisecond and less than or equal to 1000 milliseconds, preferably greater than or equal to 10 milliseconds and less than or equal to 100 milliseconds.

The memory unit MEM stores a program to be executed by the arithmetic unit CPU.

For example, in the case where a period in which the start signal is supplied is shorter than predetermined time, the microcontroller 137 supplies the control pulse signal one time.

In the case where the period in which the start signal is supplied is longer than or equal to the predetermined time, the microcontroller 137 supplies the control pulse signal plural times at intervals depending on the pulse interval modulation signal.

When the microcontroller 137 supplies the control pulse signal plural times, the number of times of supplying the control pulse signal can be limited. Alternatively, the control pulse signal can be supplied as many times as possible in a period in which the start signal is continuously supplied. Further alternatively, the control pulse signal can be supplied as many times as possible in a period from the time when the supply of the start signal is stopped to the time when the supply of the start signal is started again.

A structure in which the control pulse signal can be intermittently supplied until the start signal is supplied again is described below.

The start signal with a high level or a low level is supplied to the microcontroller 137 in a standby state with the switch 132. The microcontroller 137 supplies a rectangular wave with a predetermined width as the control pulse signal and measures time in which the start signal is supplied.

In the case where the period in which the start signal is supplied is shorter than the predetermined time, the microcontroller 137 supplies the control pulse signal one time and then returns to a standby state.

In the case where the period in which the start signal is supplied is longer than or equal to the predetermined time, the microcontroller 137 determines a pulse interval in accordance with the digital signal obtained by converting the pulse interval modulation signal, and intermittently supplies the control pulse signal at predetermined pulse intervals until the start signal is supplied again.

<<Start Switch Circuit>>

The start switch circuit 131 supplies the start signal with a high level or a low level in a period in which the switch 132 is operated (see FIG. 2).

Note that the start switch circuit 131 can also supply the control pulse signal. For example, the start switch circuit 131 can be configured using the switch 132, a latch circuit, and a monostable multivibrator.

Specifically, the switch 132 is used to supply a high or low signal to the latch circuit. The latch circuit supplies a trigger signal. The monostable multivibrator supplied with the trigger signal supplies a rectangular wave with a predetermined width as the control pulse signal.

<<Pulse Interval Modulation Circuit>>

The pulse interval modulation circuit 135 can supply the pulse interval modulation signal. For example, a voltage changed using a variable resistor 136 can be used for the pulse interval modulation signal. The pulse interval modulation signal adjusts intervals at which pulsed light is emitted from the light-emitting element 120. The pulsed light is emitted at, for example, less than 60 Hz, preferably less than or equal to 20 Hz, particularly preferably less than or equal to 5 Hz. The pulsed light is not necessarily emitted at regular intervals and may be emitted at irregular intervals.

<<Sensor Circuit>>

As a sensor that senses the state of attachment or detachment, a mechanical switch, an optical switch, a magnetic sensor, or the like can be used.

Note that the use history of the light-emitting element 120 can be stored using a memory circuit to estimate the degree of degradation of the light-emitting element 120. The amount of current supplied by the constant current supply 140 is controlled so that the estimated degree of degradation of the light-emitting element 120 is compensated.

This embodiment can be combined with any of the other embodiments in this specification as appropriate.

Embodiment 2

In this embodiment, a structure of an information processing device of one embodiment of the present invention will be described with reference to FIGS. 4A1, 4A2, 4B1, 4B2, 4C1, and 4C2, and FIG. 5.

FIGS. 4A1, 4A2, 4B1, 4B2, 4C1, and 4C2 illustrate a structure of an information processing device 200C of one embodiment of the present invention.

FIGS. 4A1 and 4A2 are a side view and a top view, respectively, of the information processing device 200C of one embodiment of the present invention.

FIGS. 4B1 and 4B2 are a side view and a top view, respectively, of an optical component 255C of the information processing device 200C of one embodiment of the present invention.

FIGS. 4C1 and 4C2 are a side view and a top view, respectively, of a housing 250C, a light-emitting element 120C, and an imaging unit 150 of the information processing device 200C of one embodiment of the present invention.

Figure 5:
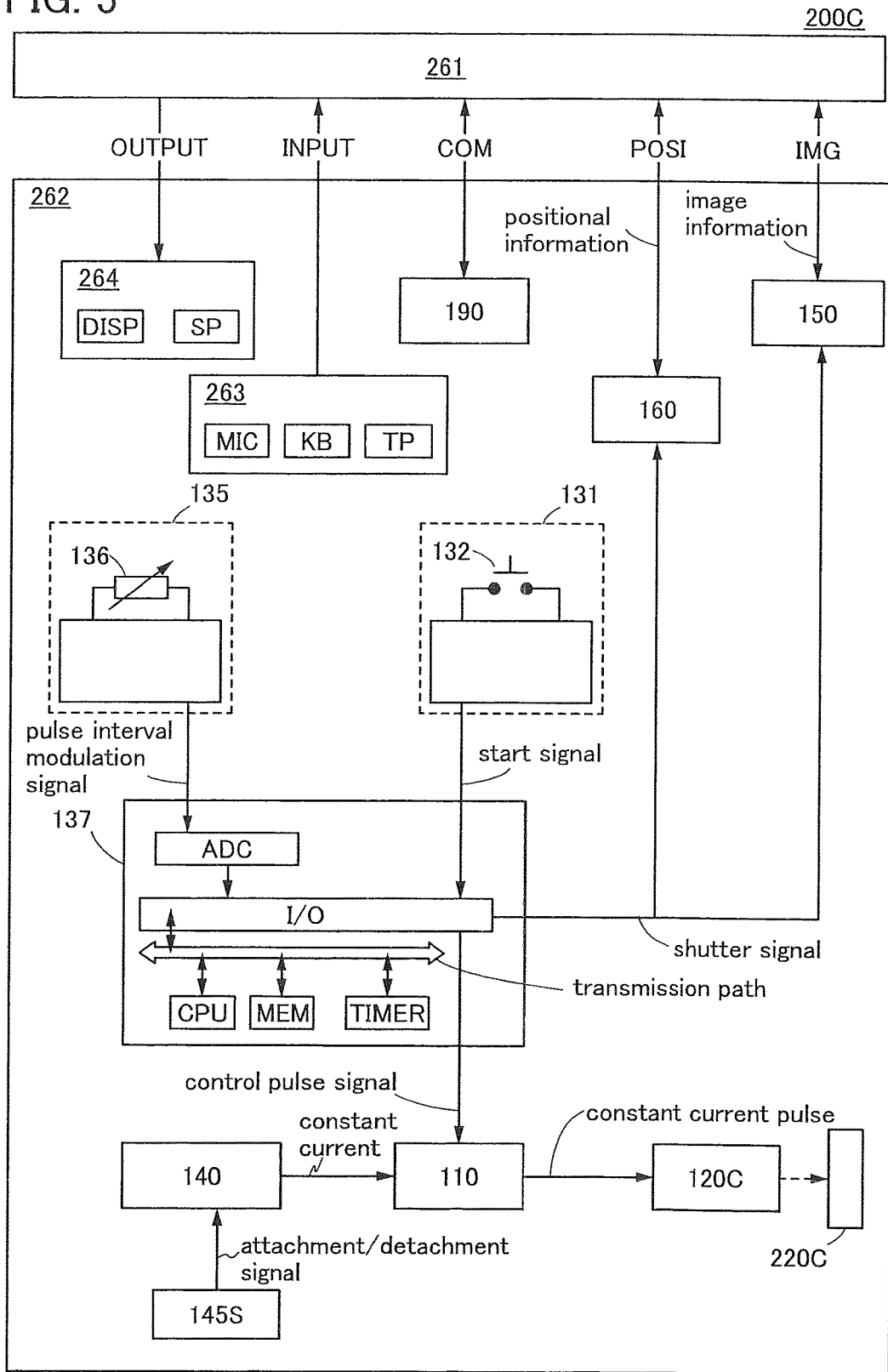
FIG. 5 is a block diagram illustrating a structure of an information processing device according to an embodiment.

FIG. 5 is a block diagram illustrating the structure of the information processing device of one embodiment of the present invention.

The information processing device 200C described in this embodiment includes the light-emitting element 120C, the imaging unit 150 which can perform imaging in an emission direction of light from the light-emitting element 120C, the housing 250C provided with the light-emitting element 120C and the imaging unit 150, and the optical component 255C attachable and detachable to/from the housing 250C (see FIGS. 4A1, 4A2, 4B1, 4B2, 4C1, and 4C2).

The light-emitting element 120C includes a first electrode, a second electrode overlapping with the first electrode, and a layer containing a light-emitting organic compound which is provided between the first electrode and the second electrode. The optical component 255C includes an attaching member 210C and an optical sheet 220C. The attaching member 210C engages with the housing 250C. The optical sheet 220C attached to the housing 250C using the attaching member 210C condenses light emitted from the light-emitting element 120C.

The optical sheet 220C includes a planar prism, a Fresnel lens, or a fly-eye lens.

The information processing device 200C described in this embodiment can perform imaging while condensed light is emitted in a state where the optical component 255C is attached and diffused light is emitted in a state where the optical component 255C is detached. Consequently, a novel information processing device capable of selecting the direction of light emission can be provided.

The information processing device 200C includes the sensor circuit 145S that senses a state of attachment or detachment of the optical component 255C and supplies the attachment/detachment signal, and the constant current supply 140 that is supplied with the attachment/detachment signal and supplies constant current having a predetermined amount in accordance with the attachment/detachment signal. The light-emitting element 120C is supplied with constant current having a predetermined amount in accordance with the attachment/detachment signal.

The information processing device 200C described in this embodiment includes the constant current supply 140. The constant current supply 140 supplies current whose amount is changed depending on the state of attachment and detachment of the optical component 255C. With this structure, the light-emitting element 120C in a state where the optical component 255C is detached can be driven using current whose amount is different from that of current for driving the light-emitting element 120C in a state where the optical component 255C is attached, so that diffused light can be emitted. Consequently, a novel information processing device capable of selecting the intensity and the direction of light emission can be provided (see FIGS. 4A1, 4A2, 4B1, 4B2, 4C1, and 4C2).

The information processing device 200C described in this embodiment includes an arithmetic unit 261 and an input/output unit 262. The arithmetic unit 261 is supplied with image information IMG, positional information POSI, and an operation instruction INPUT and supplies communication information COM and output information OUTPUT including display information. The input/output unit 262 is supplied with the communication information COM and the output information OUTPUT including the display information and supplies the image information IMG, the positional information POSI, and the operation instruction INPUT (see FIG. 5).

The information processing device 200C includes the housing 250C in which the arithmetic unit 261 and the input/output unit 262 are installed.

The input/output unit 262 includes the start switch circuit 131 which includes the switch 132 and supplies the start signal when the switch 132 is operated.

The information processing device 200C includes the microcontroller 137 that is supplied with the start signal and supplies the control pulse signal and a shutter signal, the switching circuit 110 that is supplied with the control pulse signal and the constant current and supplies the constant current pulse, the constant current supply 140 that supplies the constant current, and the light-emitting element 120C that is supplied with the constant current pulse and emits pulsed light to the outside of the housing 250C.

The information processing device 200C includes the imaging unit 150 that is supplied with the shutter signal, performs imaging in an emission direction of the pulsed light, and supplies the image information IMG; a positional information acquiring circuit 160 that can be supplied with the shutter signal and supply the positional information POSI; and a communication unit 190 that transmits the communication information COM to a communication network.

The information processing device 200C includes an input mechanism 263 and an output mechanism 264. The input mechanism 263 supplies the operation instruction INPUT. The output mechanism 264 is supplied with the output information OUTPUT including the display information and includes a display unit DISP that displays the display information.

The communication unit 190 can transmit the image information IMG to the communication network.

The information processing device 200C described in this embodiment includes the pulse interval modulation circuit 135. The pulse interval modulation circuit 135 includes the variable resistor 136 and supplies the pulse interval modulation signal.

The information processing device 200C described in this embodiment includes the light-emitting element 120C that emits pulsed light in accordance with the operation of the switch 132, the imaging unit 150 that performs imaging in an emission direction of the pulsed light and supplies the image information IMG, and the communication unit 190 that transmits the image information IMG to the communication network. Thus, a photograph can be taken in a state where the pulsed light is emitted to a photographic subject, or information including an image can be transmitted to the communication network.

<Information Processing Device>

The following describes individual components included in the information processing device 200C of one embodiment of the present invention.

Note that a structure of the information processing device 200C described in this embodiment is different from that of the light-emitting device 200 described in Embodiment 1 in the following points: the imaging unit 150 that is supplied with the shutter signal is provided; an opening for placing the imaging unit 150 is provided in the light-emitting element 120C, the housing 250C, the attaching member 210C, and the optical sheet 220C; the arithmetic unit 261 is provided; the microcontroller 137 supplies the shutter signal; and the input/output unit 262 including the positional information acquiring circuit 160 that is supplied with the shutter signal, the communication unit 190, the input mechanism 263, and the output mechanism 264 is provided. Parts different from those in Embodiment 1 are described in detail below, and the above description is referred to for the other similar parts.

<<Imaging Unit>>

When the light-emitting element 120C emits light, the imaging unit 150 performs imaging in an emission direction of light from the light-emitting element 120C. For example, a digital still camera, a digital video camera, a silver salt camera, or the like can be used.

Specifically, the light-emitting element 120C and the imaging unit 150 are provided for the housing 250C. The imaging unit 150 is oriented in an emission direction of light from the light-emitting element 120C. For example, the opening is provided in the light-emitting element 120C, and a lens of the imaging unit 150 is provided in the opening of the light-emitting element 120C (see FIG. 4A2).

In a state where the optical component 255C is detached, the light-emitting element 120C can emit diffused light to a photographic subject. When the photographic subject is irradiated with the diffused light, an image in which an obtrusive shadow is hardly produced can be taken.

In a state where the optical component 255C is attached, the light-emitting element 120C can emit condensed light to the photographic subject. When the photographic subject is irradiated with the condensed light, a bright image can be taken. For example, an image of a distant photographic subject can be taken clearly in a dark place.

<<Arithmetic Unit and Input/Output Unit>>

The arithmetic unit 261 is supplied with the image information IMG, the positional information POSI, and the operation instruction INPUT and supplies the communication information COM and the output information OUTPUT including the display information.

The input/output unit 262 is supplied with the communication information COM and the output information OUTPUT including the display information and supplies the image information IMG, the positional information POSI, and the operation instruction INPUT.

The arithmetic unit 261 includes an arithmetic circuit, a memory unit for storing a program to be executed by the arithmetic circuit, a transmission path, an input/output interface, and the like.

The input/output unit 262 includes the start switch circuit 131, the switch 132, the microcontroller 137, the switching circuit 110, the light-emitting element 120C, the constant current supply 140, the imaging unit 150, the positional information acquiring circuit 160, the communication unit 190, the input mechanism 263, the output mechanism 264, and the like.

<<Input Mechanism>>

A mechanism for supplying information to the information processing device 200C can be used for the input mechanism 263.

Examples of a mechanism for supplying audio information, the operation instruction, or the like are a microphone MIC, a keyboard KB, and a touch panel TP.

Specifically, a user can supply audio information using the microphone MIC. The arithmetic unit 261 can convert the audio information to an analog signal or a digital signal and supply the converted audio information. The communication unit 190 can supply the converted audio information with or without wire. The communication network can supply the audio information to a remote place, for example.

<<Output Mechanism>>

A mechanism for supplying information to a user of the information processing device 200C can perceive the information can be used for the output mechanism 264.

For example, in the case where the output information OUTPUT including the audio information and/or the image information is supplied to the output mechanism 264, a speaker SP can be used for the output mechanism 264 so that the audio information can be acquired by the user of the information processing device 200C through the sense of hearing. Furthermore, a display unit DISP or the like can be used for the output mechanism 264 so that the display information can be acquired through the sense of sight.

For example, a display panel including a plurality of display elements arranged in a matrix can be used for the display unit DISP. Specifically, a liquid crystal display panel, an organic EL panel, electronic paper, or the like can be used for the display unit DISP.

Note that one information processing device 200C can acquire the audio information supplied from the other information processing device, through the communication network.

The communication unit 190 acquires the information COM including the audio information supplied from the communication network and supplies the information COM. The arithmetic unit 261 supplies the output information OUTPUT including the audio information. The speaker SP reproduces the audio information.

With such a structure, the user of the information processing device 200C can acquire the audio information supplied from the remote place by reproducing it. Thus, the information processing device 200C can be used as a mobile phone.

This embodiment can be combined with any of the other embodiments in this specification as appropriate.

Embodiment 3

In this embodiment, a structure of a light-emitting panel that can be used for the light-emitting device of one embodiment of the present invention is described with reference to FIGS. 6A and 6B, FIGS. 7A and 7B, FIGS. 8A and 8B, and FIGS. 9A to 9C.

The light-emitting device of one embodiment of the present invention can be used as, for example, a camera flash. As a camera flash decreases in size, the shape of its light-emitting portion becomes more linear or point-like. Since light from a light source travels in a straight line, a smaller light source casts a sharper shadow of an object. Thus, when a photograph of a human face is taken in a dark place using a flash, for example, a shadow of a nose might be cast on a cheek.

In addition, when the intensity of a flash is excessively high, a portion having different brightness in reality might become uniformly white in a photograph (i.e., blown-out highlights). In contrast, when the intensity of a flash is too low, a dark portion of a photograph might become uniformly black (i.e., blocked up shadows). Thus, a flash is preferably capable of adjusting the amount of light depending on the environment and the condition of a photographic subject.

In view of the above, a light-emitting element that is a planar light source is used for a light-emitting panel in one embodiment of the present invention. For example, with the use of an organic EL element, a thin and large-area element can be formed easily. When a planar light source, a point light source, and a line light source emit the same amount of light, the planar light source can have a smaller amount of light per unit area or a shorter emission time than the point light source and the line light source. Thus, the amount of heat generation per unit area can be reduced. In addition, the planar light source releases heat easily because of its large light-emitting area. Thus, deterioration due to local heat generation of the light-emitting panel can be suppressed. A light-emitting device that has higher reliability and less deterioration of a light-emitting panel than a light-emitting device including a light-emitting diode using an inorganic material, or the like can be provided.

The light-emitting panel can be thinner and lighter in the case of using an organic EL element than in the case of using a conventional xenon lamp or the like. Heat generated by light emission is diffused over a large area in the light-emitting panel and is therefore released efficiently. Thus, heat accumulation in the light-emitting panel is suppressed; and, deterioration of the light-emitting panel is suppressed.

In the case where the light-emitting panel is a planar light source, a shadow is less likely to be sharply cast on a photographic subject even when the light-emitting device of one embodiment of the present invention is used as a camera flash.

The light-emitting panel can be configured to emit white light by using properly selected light-emitting organic compounds. For example, a plurality of light-emitting organic compounds that emit light of complementary colors are used. Alternatively, three kinds of light-emitting organic compounds that emit light of red, green, and blue can be used. Accordingly, the light-emitting device having excellent white balance can be obtained.

By using a light-emitting organic compound, an emission spectrum can be broadened as compared to that of a light-emitting diode with an inorganic material. Light having a broad emission spectrum is close to natural light and suitable for photography.

An example of a structure of a light-emitting panel in which an organic EL element is used as a light-emitting element is described below.

<<Structure Example 1 of Light-Emitting Panel>>

FIG. 6A is a plan view illustrating a light-emitting panel of one embodiment of the present invention, and FIG. 6B is a cross-sectional view taken along the dashed-dotted line A-B in FIG. 6A.

In the light-emitting panel illustrated in FIGS. 6A and 6B, the light-emitting element 403 is provided in a space 415 surrounded by the support substrate 401, a sealing substrate 405, and a sealant 407. The light-emitting element 403 is an organic EL element having a bottom-emission structure; specifically, the first electrode 421 that transmits visible light is provided over the support substrate 401, the EL layer 423 is provided over the first electrode 421, and the second electrode 425 that reflects visible light is provided over the EL layer 423.

The structure of the light-emitting element used in one embodiment of the present invention is not limited to the bottom-emission structure and may be, for example, a top-emission structure.

A first terminal 409a is electrically connected to an auxiliary wiring 417 and the first electrode 421. An insulating layer 419 is provided over the first electrode 421 in a region overlapping the auxiliary wiring 417. The first terminal 409a is electrically insulated from the second electrode 425 by the insulating layer 419. A second terminal 409b is electrically connected to the second electrode 425. Note that although the first electrode 421 is formed over the auxiliary wiring 417 in this embodiment, the auxiliary wiring 417 may be formed over the first electrode 421.

An outcoupling structure 411a is preferably provided at the interface between the support substrate 401 and the atmosphere. When provided at the interface between the support substrate 401 and the atmosphere, the outcoupling structure 411a can reduce light that cannot be extracted to the atmosphere because of total reflection, resulting in increased light extraction efficiency of the light-emitting panel.

In addition, an outcoupling structure 411b is preferably provided between the light-emitting element 403 and the support substrate 401. In the case where the outcoupling structure 411b has unevenness, a planarization layer 413 is preferably provided between the outcoupling structure 411b and the first electrode 421. This enables the first electrode 421 to be a flat film, and generation of leakage current in the EL layer 423 due to the unevenness of the first electrode 421 can be prevented. In addition, because of the outcoupling structure 411b at the interface between the planarization layer 413 and the support substrate 401, light that cannot be extracted to the atmosphere due to total reflection can be reduced, so that the light extraction efficiency of the light-emitting panel can be increased.

As a material of the outcoupling structure 411a and the outcoupling structure 411b, a resin can be used, for example. Alternatively, for the outcoupling structure 411a and the outcoupling structure 411b, a hemispherical lens, a micro lens array, a film provided with an uneven surface structure, a light diffusing film, or the like can be used. For example, the outcoupling structure 411a and the outcoupling structure 411b can be formed by attaching the lens or film to the support substrate 401 with an adhesive or the like having substantially the same refractive index as the support substrate 401 or the lens or film.

The surface of the planarization layer 413 that is in contact with the first electrode 421 is flatter than the surface of the planarization layer 413 that is in contact with the outcoupling structure 411b. As a material of the planarization layer 413, a material with a light-transmitting property and a high refractive index (e.g., glass or a resin) can be used.

Note that the light-emitting panel of one embodiment of the present invention is not necessarily provided with any light extraction structure. In that case, the second electrode that reflects visible light can be used as a mirror, which is preferable.

<<Structure Example 2 of Light-Emitting Panel>>

Figure 7A:
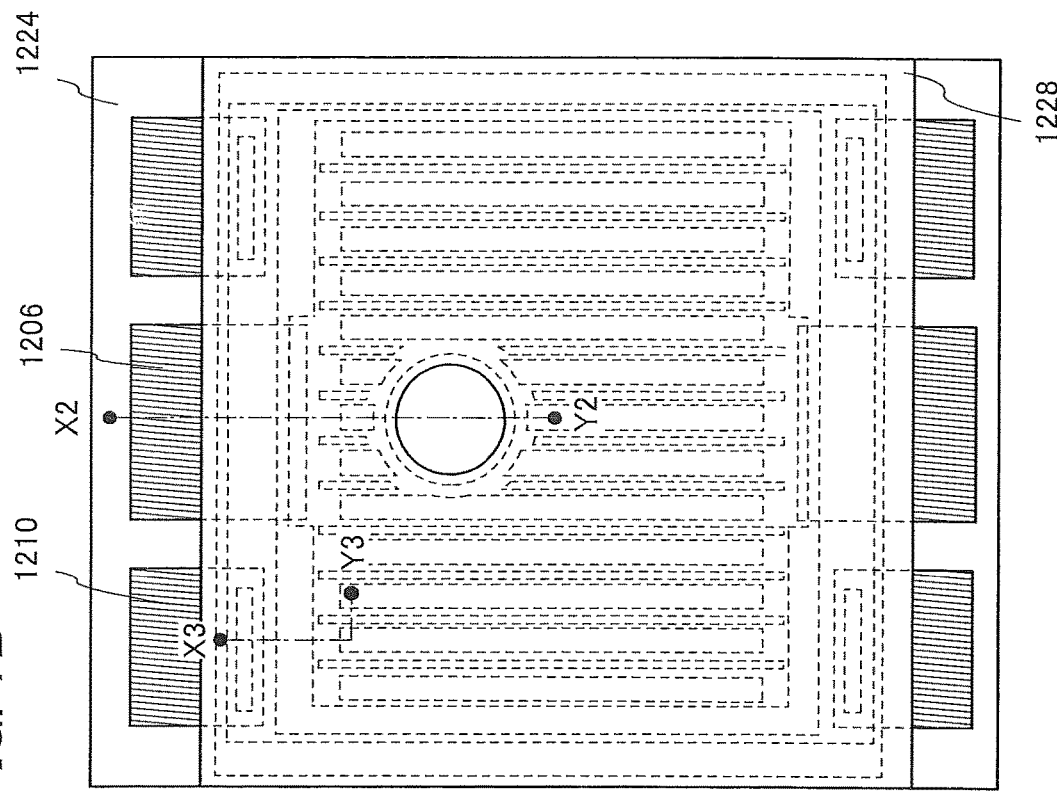
FIGS. 7A and 7B each illustrate a light-emitting panel.

FIG. 7A is a plan view illustrating a light-emitting panel of one embodiment of the present invention, and FIGS. 8A and 8B are each a cross-sectional view taken along the dashed-dotted line X1-Y1 in FIG. 7A.

In the light-emitting panel illustrated in FIG. 8A, a light-emitting element 1250 is provided over a support substrate 1220 with an insulating film 1224 therebetween. The auxiliary wiring 1206 is provided over the insulating film 1224 and is electrically connected to the first electrode 1201. The auxiliary wiring 1206 is partly exposed and functions as a terminal. An end portion of the first electrode 1201 and an end portion of a conductive layer 1210 are covered with a partition wall 1205. In addition, the partition wall 1205 is provided to cover the auxiliary wiring 1206 with the first electrode 1201 therebetween. The light-emitting element 1250 is sealed with the support substrate 1220, a sealing substrate 1228, and a sealant 1227. An outcoupling structure 1209 is attached to the surface of the support substrate 1220. A flexible light-emitting panel can be obtained by using flexible substrates as the support substrate 1220 and the sealing substrate 1228.

The light-emitting element 1250 is an organic EL element having a bottom-emission structure; specifically, the first electrode 1201 transmitting visible light is provided over the support substrate 1220, an EL layer 1202 is provided over the first electrode 1201, and a second electrode 1203 reflecting visible light is provided over the EL layer 1202.

In the light-emitting panel illustrated in FIG. 8B, a support substrate 1229 having an outcoupling structure is provided instead of the support substrate 1220 and the outcoupling structure 1209 of the light-emitting panel illustrated in FIG. 8A. The support substrate 1229 has both a function as a support and a function of improving the light extraction efficiency of the light-emitting panel.

The methods for forming a light-emitting panel over a flexible substrate are exemplified by a first method in which the light-emitting element is directly formed over a flexible substrate and a second method in which the light-emitting element is formed over a highly heat-resistant substrate (hereinafter referred to as a formation substrate) and the light-emitting element is transferred to the flexible substrate.

When a glass substrate thin enough to have flexibility is used, the first method is preferably employed, in which case the process can be simplified.

When the second method is employed, an insulating film with low water permeability that is formed over a formation substrate can be transferred to a flexible substrate. Thus, even when an organic resin with high water permeability and low heat resistance is used for the flexible substrate, a flexible light-emitting panel with high reliability can be fabricated.

<<Structure Example 3 of Light-Emitting Panel>>

Figure 7B:
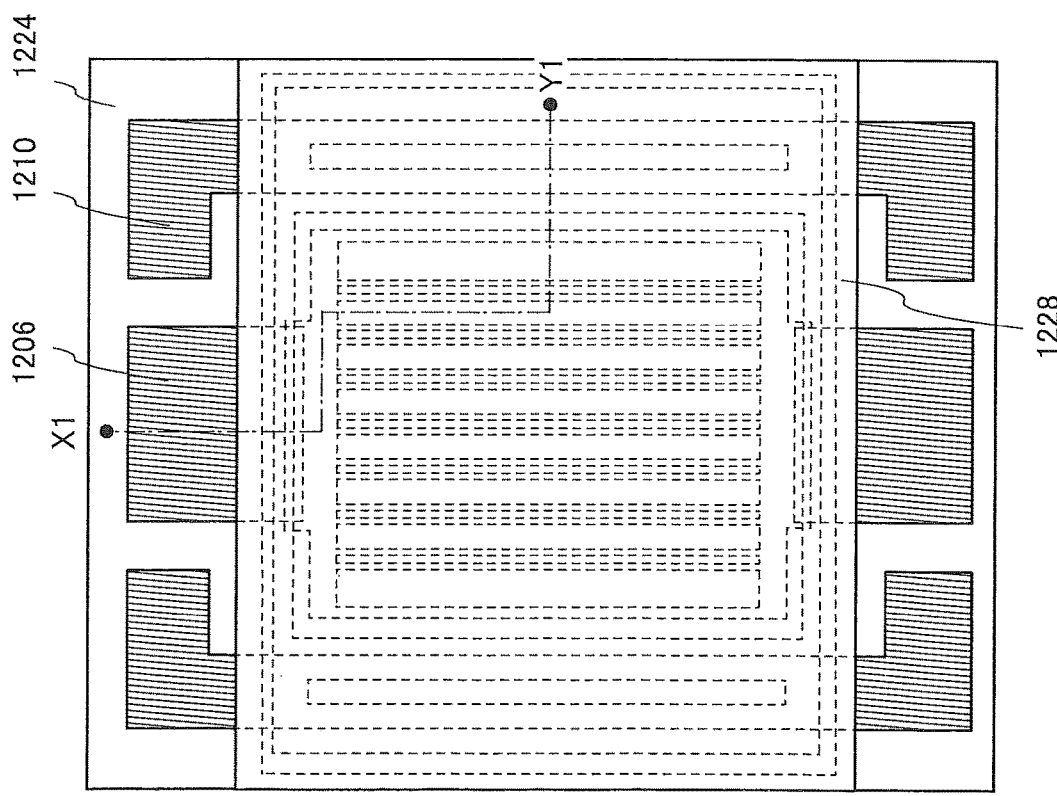
Figure 9A:
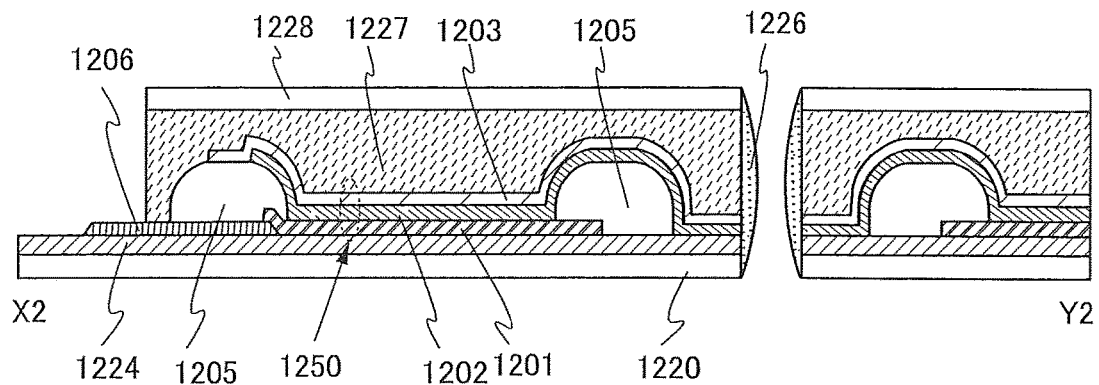
FIGS. 9A to 9C each illustrate a light-emitting panel.
Figure 9B:
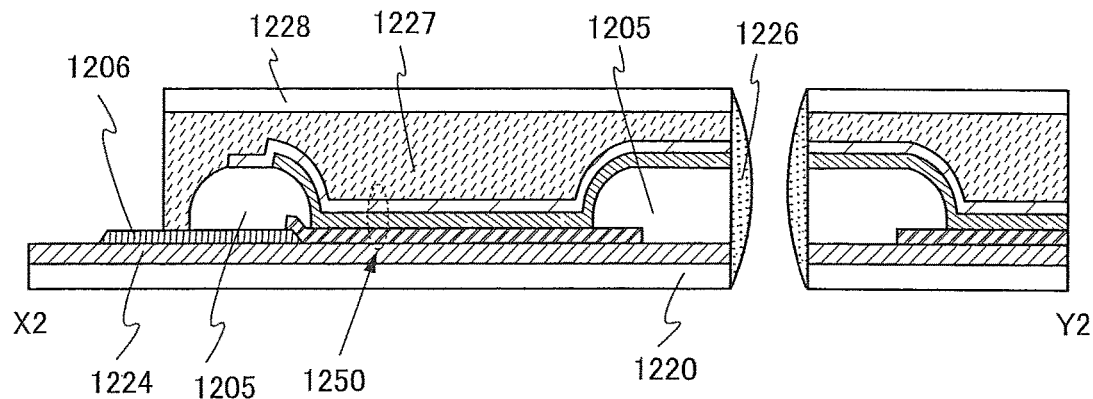
Figure 9C:
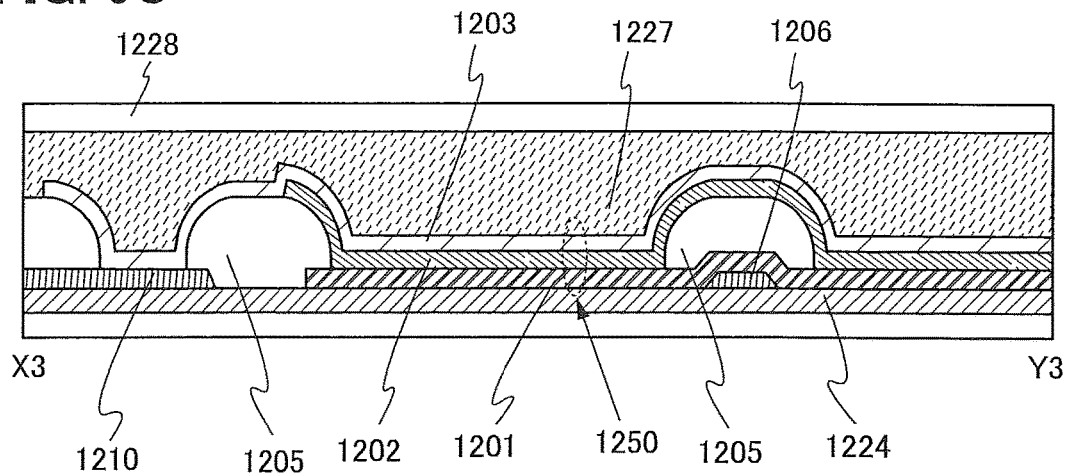

FIG. 7B is a plan view of a light-emitting panel of one embodiment of the present invention. FIGS. 9A and 9B are examples of the cross-sectional views taken along the dashed-dotted line X2-Y2 in FIG. 7B. FIG. 9C is a cross-sectional view taken along the dashed-dotted line X3-Y3 in FIG. 7B.

The light-emitting panels illustrated in FIGS. 9A to 9C are different from the light-emitting panels described in Structure example 2 in that openings are provided in parts of the light-emitting panels. Here, only different components are described in detail, and the description of the light-emitting panels in Structure example 2 can be referred to for the common components.

As illustrated in FIGS. 9A and 9B, the light-emitting panel preferably includes a sealant 1226 in the opening to prevent an electrode or an EL layer from being exposed. Specifically, an opening is formed in the light-emitting panel, and then the sealant 1226 is formed to cover at least an exposed electrode and an exposed EL layer. The sealant 1226 may be the same material as or a different material from the sealant 1227.

Note that the opening may be formed by irradiation with a laser beam. In that case, it is desirable that a short-circuit between the electrode serving as a cathode and the electrode serving as an anode do not occur. Thus, for example, it is desirable that the electrode serving as a cathode and the electrode serving as an anode do not overlap with each other in the opening and in the vicinity of the opening. That is, it is desirable that the electrode serving as a cathode and/or the electrode serving as an anode do not overlap with the opening. FIGS. 9A and 9B show an example of such a case. Note that one embodiment of the present invention is not limited thereto.

FIG. 9A illustrates an example of an opening formed in a region where the partition wall 1205 is not provided. FIG. 9B illustrates an example of an opening formed in a region where the partition wall 1205 is provided.

A light-emitting panel is fabricated in the above-described manner, and a camera lens is provided to overlap the opening, whereby a light-emitting portion can be provided around the camera lens. The light-emitting portion can be used as a camera flash.

Note that an outcoupling structure may be provided on a surface of the substrate.

<<Material of Light-Emitting Panel>>

Examples of materials that can be used for the light-emitting panel of one embodiment of the present invention are described.

[Substrate]

The substrate on the side from which light from the light-emitting element is extracted is formed using a material that transmits the light. For example, a material such as glass, quartz, ceramics, sapphire, or an organic resin can be used.

The weight and thickness of the light-emitting panel can be decreased by using a thin substrate. A flexible light-emitting panel can be obtained by using a substrate that is thin enough to have flexibility. The flexible light-emitting panel can be stored folded when not in use. The flexible light-emitting panel can be used as a lighting device that emits a flash light over a large area, as an alternative to a board reflector in a photography studio. Alternatively, a foldable lighting device can be provided.

Examples of glass include alkali-free glass, barium borosilicate glass, and aluminoborosilicate glass.

Examples of a material that has flexibility and transmits visible light include flexible glass, polyester resins such as poly(ethylene terephthalate) (PET) and poly(ethylene naphthalate) (PEN), a polyacrylonitrile resin, a polyimide resin, a poly(methyl methacrylate) resin, a polycarbonate (PC) resin, a polyethersulfone (PES) resin, a polyimide resin, a polycycloolefin resin, a polystyrene resin, a polyamideimide resin, and a poly(vinyl chloride) (PVC) resin. In particular, a material whose thermal expansion coefficient is low is preferred, and for example, a polyamideimide resin, a polyimide resin, or PET can be suitably used. A substrate whose thermal expansion coefficient is reduced by mixing an organic resin with an inorganic filler such as a glass fiber can also be used. A substrate using such a material is lightweight, and a light-emitting panel using this substrate can also be lightweight accordingly.

Since the substrate through which light emission is not extracted does not need to have a light-transmitting property, a metal substrate using a metal or an alloy or the like can be used as well as the above-described substrates. A metal and an alloy, which have high thermal conductivity, are preferably used, in which case heat can be conducted to the whole sealing substrate, so that a local temperature rise in the light-emitting panel can be prevented. To obtain flexibility and bendability, the thickness of a metal substrate is preferably greater than or equal to 10 μm and less than or equal to 200 μm, more preferably greater than or equal to 20 μm and less than or equal to 50 μm.

Although there is no particular limitation on a material of the metal substrate, it is preferable to use, for example, aluminum, copper, nickel, a metal alloy such as an aluminum alloy or stainless steel.

It is preferable to use a substrate subjected to insulation treatment in such a manner that a surface of the conductive substrate is oxidized or an insulating film is formed on the surface. An insulating film may be formed by, for example, a coating method such as a spin-coating method or a dipping method, an electrodeposition method, an evaporation method, or a sputtering method. An oxide film may be formed on the substrate surface by exposure to or heating in an oxygen atmosphere or by an anodic oxidation method or the like.

The flexible substrate may have a stacked structure of a layer of any of the above-mentioned materials and a hard coat layer (e.g., a silicon nitride layer) that protects a surface of the light-emitting panel from damage, a layer (e.g., an aramid resin layer) that can disperse pressure, or the like. Furthermore, to suppress a decrease in the lifetime of the light-emitting element due to moisture and the like, an insulating film with low water permeability may be provided. For example, a film containing nitrogen and silicon (e.g., a silicon nitride film, a silicon oxynitride film) or a film containing nitrogen and aluminum (e.g., an aluminum nitride film) may be provided.

When a glass layer is used, a barrier property against water and oxygen can be improved and thus a reliable light-emitting panel can be provided.

A substrate in which a glass layer, an adhesive layer, and an organic resin layer are stacked from the side closer to a light-emitting element can be used. The thickness of the glass layer is greater than or equal to 20 μm and less than or equal to 200 μm, preferably greater than or equal to 25 μM and less than or equal to 100 μm. With such a thickness, the glass layer can have both a high barrier property against water and oxygen and high flexibility. The thickness of the organic resin layer is greater than or equal to 10 μm and less than or equal to 200 μm, preferably greater than or equal to 20 μm and less than or equal to 50 μm. With such an organic resin layer provided on an outer side of the glass layer, breakage or a crack of the glass layer can be inhibited, resulting in a highly reliable and flexible light-emitting panel with increased mechanical strength.

[Insulating Film]

An insulating film may be provided between the support substrate and the light-emitting element. As the insulating film, an inorganic insulating film such as a silicon oxide film, a silicon nitride film, a silicon oxynitride film, or a silicon nitride oxide film can be used. In order to suppress the entrance of moisture or the like into the light-emitting element, an insulating film with low water permeability such as a silicon oxide film, a silicon nitride film, or an aluminum oxide film is particularly preferable. For a similar purpose and with a similar material, an insulating film covering the light-emitting element may be provided.

[Partition Wall]

For the partition wall, an organic resin or an inorganic insulating material can be used. As the organic resin, for example, a polyimide resin, a polyamide resin, an acrylic resin, a siloxane resin, an epoxy resin, or a phenol resin can be used. As the inorganic insulating material, silicon oxide, silicon oxynitride, or the like can be used. A photosensitive resin is preferably used for easy formation of the partition wall.

There is no particular limitation on the method for forming the partition wall. A photolithography method, a sputtering method, an evaporation method, a droplet discharging method (e.g., an inkjet method), a printing method (e.g., a screen printing method or an offset printing method), or the like can be used.

[Auxiliary Wiring]

The auxiliary wiring is not necessarily provided; however, the auxiliary wiring is preferably provided because voltage drop due to the resistance of an electrode can be prevented.

For the auxiliary wiring, a single layer or a stacked layer using a material selected from copper (Cu), titanium (Ti), tantalum (Ta), tungsten (W), molybdenum (Mo), chromium (Cr), neodymium (Nd), scandium (Sc), or nickel (Ni) or an alloy including any of these materials as its main component is used. Aluminum can also be used as a material of the auxiliary wiring, and in that case, in order to prevent corrosion, a stacked layer is formed and aluminum is used for a layer which is not in contact with ITO (indium tin oxide) or the like. The thickness of the auxiliary wiring can be greater than or equal to 0.1 µm and less than or equal to 3 µm, preferably greater than or equal to 0.1 µm and less than or equal to 0.5 µm.

[Sealant]

A method for sealing the light-emitting panel is not limited, and either solid sealing or hollow sealing can be employed. For example, a glass material such as a glass frit, or a resin material such as a resin that is curable at room temperature (e.g., a two-component-mixture-type resin), a photo-curable resin, or a thermally curable resin can be used. The light-emitting panel may be filled with an inert gas such as nitrogen or argon, or resin such as a PVC resin, an acrylic resin, a polyimide resin, an epoxy resin, a silicone resin, a poly(vinyl butyral) (PVB) resin, or an ethylene vinyl acetate (EVA) resin. A drying agent may be contained in the resin.

[Outcoupling Structure]

For the outcoupling structure, a hemispherical lens, a micro lens array, a film provided with an uneven surface structure, a light diffusing film, or the like can be used. For example, the outcoupling structure can be formed by attaching the lens or film to the substrate with an adhesive or the like that has substantially the same refractive index as the substrate or the lens or film.

The light-emitting panels described in this embodiment are planar light sources. Thus, by using each of the light-emitting panels in a light-emitting device, the light-emitting device is less likely to produce a sharp shadow on a photographic subject even when used as a flash. A light-emitting panel of the light-emitting device is less likely to deteriorate even when it emits a large amount of light as compared to the case of using a light-emitting diode or the like using an inorganic material. Thus, the light-emitting device can have high reliability. The light-emitting device can be small and thin as compared to the case of using a xenon lamp or the like.

This embodiment can be combined with any of the other embodiments in this specification as appropriate.

Embodiment 4

In this embodiment, light-emitting elements that can be used in the light-emitting device of one embodiment of the present invention are described with reference to FIGS. 10A to 10D.

<<Structure Example of Light-Emitting Element>>

Figure 10A:
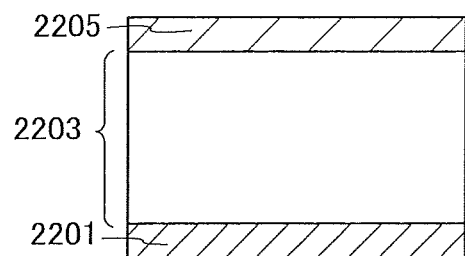
FIGS. 10A to 10D each illustrate a light-emitting element.

A light-emitting element illustrated in FIG. 10A includes an EL layer 2203 between a first electrode 2201 and a second electrode 2205. In this embodiment, the first electrode 2201 serves as the anode, and the second electrode 2205 serves as the cathode.

When a voltage higher than the threshold voltage of the light-emitting element is applied between the first electrode 2201 and the second electrode 2205, holes are injected to the EL layer 2203 from the first electrode 2201 side and electrons are injected to the EL layer 2203 from the second electrode 2205 side. The injected electrons and holes are recombined in the EL layer 2203 and a light-emitting organic compound contained in the EL layer 2203 emits light.

The EL layer 2203 includes at least a light-emitting layer 2303 containing a light-emitting organic compound.

In addition to the light-emitting layer 2303, the EL layer 2203 may further include one or more layers containing any of a substance with a high hole-injection property, a substance with a high hole-transport property, a substance with a high electron-transport property, a substance with a high electron-injection property, a substance with a bipolar property (a substance with a high electron-transport property and a high hole-transport property), and the like. For the EL layer 2203, either a low molecular compound or a high molecular compound can be used, and an inorganic compound may also be used.

Figure 10B:
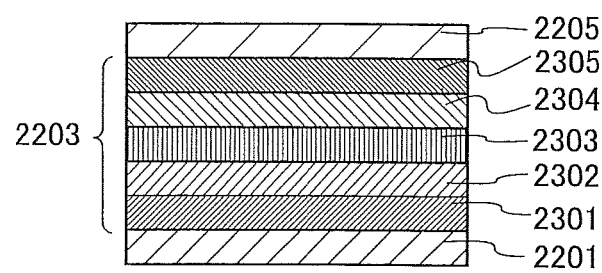

A light-emitting element illustrated in FIG. 10B includes the EL layer 2203 between the first electrode 2201 and the second electrode 2205, and in the EL layer 2203, a hole-injection layer 2301, a hole-transport layer 2302, the light-emitting layer 2303, an electron-transport layer 2304, and an electron-injection layer 2305 are stacked in this order from the first electrode 2201 side.

Figure 10C:
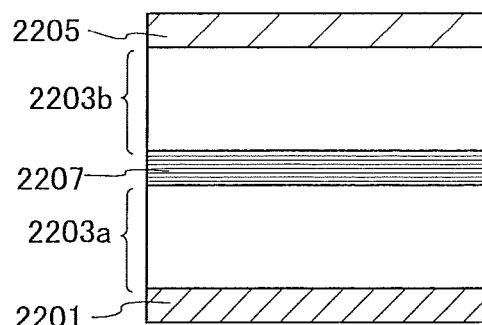
Figure 10D:
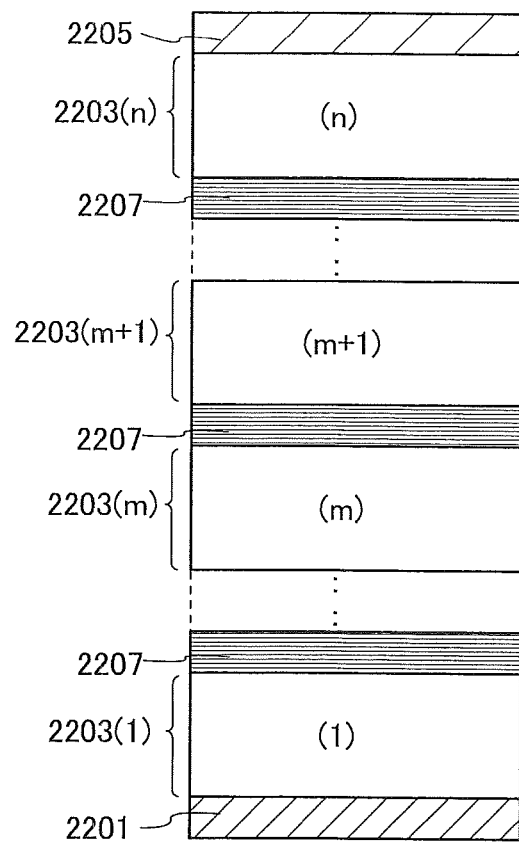

As in light-emitting elements illustrated in FIGS. 10C and 10D, a plurality of EL layers may be stacked between the first electrode 2201 and the second electrode 2205. In that case, an intermediate layer 2207 is preferably provided between the stacked EL layers. The intermediate layer 2207 includes at least a charge-generation region.

For example, the light-emitting element illustrated in FIG. 10C includes the intermediate layer 2207 between a first EL layer 2203$a$ and a second EL layer 2203$b$. The light-emitting element illustrated in FIG. 10D includes n EL layers 2203(1) to 2203 ($n$) ($n$ is a natural number of 2 or more), and the intermediate layers 2207 between the EL layers.

The behaviors of electrons and holes in the intermediate layer 2207 provided between the EL layer 2203($m$) and the EL layer 2203($m$+1) are described below. When a voltage higher than the threshold voltage of the light-emitting element is applied between the first electrode 2201 and the second electrode 2205, holes and electrons are generated in the intermediate layer 2207, and the holes move into the EL layer 2203($m$+1) provided on the second electrode 2205 side and the electrons move into the EL layer 2203($m$) provided on the first electrode 2201 side. The holes injected into the EL layer 2203($m$+1) are recombined with the electrons injected from the second electrode 2205 side, so that a light-emitting organic compound contained in the EL layer 2203($m$+1) emits light. The electrons injected into the EL layer 2203($m$) are recombined with the holes injected from the first electrode 2201 side, so that a light-emitting organic compound contained in the EL layer 2203($m$) emits light. Thus, the holes and electrons generated in the intermediate layer 2207 cause light emission in the respective EL layers.

Note that the EL layers can be provided in contact with each other without intermediate layer therebetween when the contact of these EL layers allows the formation of the same structure as the intermediate layer. Alternatively, when the charge-generation region is formed over one surface of an EL layer, another EL layer can be provided in contact with the surface.

When the EL layers have different emission colors, a desired emission color can be obtained from the whole light-emitting element. For example, in the light-emitting element having two EL layers, when an emission color of the first EL layer and an emission color of the second EL layer are made to be complementary colors, a light-emitting element emitting white light as a whole light-emitting element can also be obtained. This can be applied to a light-emitting element including three or more EL layers.

<<Material of Light-Emitting Element>>

Examples of materials that can be used for the layers are given below. Note that each layer is not limited to a single layer and may be a stack of two or more layers.

<Anode>

The electrode serving as the anode (the first electrode 2201) can be formed using one or more kinds of conductive metals, alloys, conductive compounds, and the like. In particular, it is preferable to use a material with a high work function (4.0 eV or more). Examples include ITO, indium tin oxide containing silicon or silicon oxide, indium zinc oxide, indium oxide containing tungsten oxide and zinc oxide, graphene, gold, platinum, nickel, tungsten, chromium, molybdenum, iron, cobalt, copper, palladium, and a nitride of a metal (e.g., titanium nitride).

When the anode is in contact with the charge-generation region, any of a variety of conductive materials can be used regardless of their work functions; for example, aluminum, silver, an alloy containing aluminum, or the like can be used.

<Cathode>

The electrode serving as the cathode (the second electrode 2205) can be formed using one or more kinds of conductive metals, alloys, conductive compounds, and the like. In particular, it is preferable to use a material with a low work function (3.8 eV or less). Examples include aluminum, silver, an element belonging to Group 1 or 2 of the periodic table (e.g., an alkali metal such as lithium or cesium, an alkaline earth metal such as calcium or strontium, or magnesium), an alloy containing any of these elements (e.g., Mg—Ag or Al—Li), a rare earth metal such as europium or ytterbium, and an alloy containing any of these rare earth metals.

Note that when the cathode is in contact with the charge-generation region, a variety of conductive materials can be used regardless of its work function. For example, ITO, indium tin oxide containing silicon or silicon oxide, or the like can be used.

The electrodes may be formed separately by a vacuum evaporation method or a sputtering method. Alternatively, when a silver paste or the like is used, a coating method or an inkjet method may be used.

<Hole-Injection Layer 2301>

The hole-injection layer 2301 contains a substance with a high hole-injection property.

Examples of the substance with a high hole-injection property include metal oxides such as molybdenum oxide, vanadium oxide, ruthenium oxide, tungsten oxide, and manganese oxide; and phthalocyanine-based compounds such as phthalocyanine (abbreviation: $H_2Pc$) and copper(II) phthalocyanine (abbreviation: CuPc).

Other examples of the substance with a high hole-injection property include high molecular compounds such as poly(N-vinylcarbazole) (abbreviation: PVK), poly(4-vinyltriphenylamine) (abbreviation: PVTPA); and an acid-doped high molecular compounds such as poly(3,4-ethylenedioxythiophene)/poly(styrenesulfonic acid) (PEDOT/PSS) is added.

The hole-injection layer 2301 may serve as the charge-generation region. In this case, a variety of conductive materials can be used for the anode regardless of their work functions. Materials contained in the charge-generation region are described below.

<Hole-Transport Layer 2302>

The hole-transport layer 2302 contains a substance with a high hole-transport property.

A substance transporting more holes than electrons is preferable as a substance with a high hole transport property, and a substance with a hole mobility of $10^{-6}$ cm$^2$/Vs or more is especially preferable. A variety of compounds can be used. For example, an aromatic amine compound such as 4,4'-bis[N-(1-naphthyl)-N-phenylamino]biphenyl (abbreviation: NPB or α-NPD) or 4-phenyl-4'-(9-phenylfluoren-9-yl)triphenylamine (abbreviation: BPAFLP); a carbazole derivative such as 4,4'-di(N-carbazolyl)biphenyl (abbreviation: CBP), 9-[4-(10-phenyl-9-anthracenyl)phenyl]-9H-carbazole (abbreviation: CzPA), or 9-phenyl-3-[4-(10-phenyl-9-anthryl)phenyl]-9H-carbazole (abbreviation: PCzPA); an aromatic hydrocarbon compound such as 2-tert-butyl-9,10-di(2-naphthyl)anthracene (abbreviation: t-BuDNA), 9,10-di (2-naphthyl)anthracene (abbreviation: DNA), or 9,10-diphenylanthracene (abbreviation: DPAnth); a high molecular compound such as PVK or PVTPA.

<Light-Emitting Layer 2303>

For the light-emitting organic compound included in the light-emitting layer 2303, a fluorescent compound or a phosphorescent compound can be used.

Examples of the fluorescent compound include N,N'-bis [4-(9H-carbazol-9-yl)phenyl]-N,N-diphenylstilbene-4,4'-diamine (abbreviation: YGA2S), N-(9,10-diphenyl-2-anthryl)-N,9-diphenyl-9H-carbazol-3-amine (abbreviation: 2PCAPA), and rubrene.

Examples of the phosphorescent compound include organometallic complexes such as bis[2-(4',6'-difluorophenyl) pyridinato-N,C$^{2'}$]iridium(III) picolinate (abbreviation: Flrpic), tris(2-phenylpyridinato-N,C$^{2'}$)iridium(III) (abbreviation: Ir(ppy)$_3$), and (acetylacetonato)bis(3,5-dimethyl-2-phenylpyrazinato)iridium(III) (abbreviation: Ir(mppr-Me)$_2$ (acac)).

The light-emitting layer 2303 may have a structure in which any of the above-described light-emitting organic compounds is dispersed as a guest material in another substance (a host material). As the host material, various kinds of materials can be used, and it is preferable to use a substance that has a lowest unoccupied molecular orbital level (LUMO level) higher than that of the guest material and has a highest occupied molecular orbital level (HOMO level) lower than that of the guest material.

With this structure, crystallization of the light-emitting layer 2303 can be suppressed. In addition, concentration quenching due to high concentration of the guest material can be suppressed.

As the host material, the above-described substance with a high hole-transport property (e.g., an aromatic amine compound or a carbazole derivative) or a later-described substance with a high electron-transport property (e.g., a metal complex having a quinoline skeleton or a benzoquinoline skeleton or a metal complex having an oxazole-based or thiazole-based ligand) can be used. As the host material, specifically, a metal complex such as tris(8-quinolinolato) aluminum(III) (abbreviation: Alq) or bis(2-methyl-8-quinolinolato)(4-phenylphenolato)aluminum(III) (abbreviation: BAlq); a heterocyclic compound such as 3-(4-biphenylyl)-4-phenyl-5-(4-tert-butylphenyl)-1,2,4-triazole (abbreviation: TAZ), bathophenanthroline (abbreviation: BPhen), or bathocuproine (abbreviation: BCP); a condensed aromatic compound such as CzPA, DNA, t-BuDNA, or DPAnth; or an aromatic amine compound such as NPB can be used.

Alternatively, as the host material, a plurality of kinds of materials can be used. For example, in order to suppress crystallization, a substance such as rubrene that suppresses crystallization may be further added. In addition, NPB, Alq, or the like may be further added in order to transfer energy to the guest material more efficiently.

When a plurality of light-emitting layers are provided and emission colors of the layers are made different, light emission of a desired color can be obtained from the light-emitting element as a whole. For example, in a light-emitting element having two light-emitting layers, the emission colors of first and second light-emitting layers are complementary, so that the light-emitting element can emit white light as a whole. This can be applied to a light-emitting element including three or more light-emitting layers.

<Electron-Transport Layer 2304>

The electron-transport layer 2304 contains a substance with a high electron-transport property.

A substance transporting more electrons than holes is preferable as a substance with a high electron transport property, and a substance with an electron mobility of $10^{-6}$ cm$^2$/Vs or more is especially preferable.

As the substance with a high electron-transport property, for example, a metal complex having a quinoline skeleton or a benzoquinoline skeleton, such as Alq or BAlq, can be used. Alternatively, a metal complex having an oxazole-based ligand or a thiazole-based ligand, such as bis[2-(2-hydroxyphenyl)benzoxazolato]zinc (abbreviation: Zn(BOX)$_2$) or bis[2-(2-hydroxyphenyl)benzothiazolato]zinc (abbreviation: Zn(BTZ)$_2$) or the like can be used. Alternatively, TAZ, BPhen, BCP, or the like can be used.

<Electron-Injection Layer 2305>

The electron-injection layer 2305 contains a substance with a high electron-injection property.

Examples of the substance with a high electron-injection property include alkali metals, alkaline earth metals, and compounds thereof, such as lithium, cesium, calcium, lithium fluoride, cesium fluoride, calcium fluoride, and lithium oxide. A rare earth metal compound such as erbium fluoride can also be used. Any of the above substances for the electron-transport layer 2304 can also be used.

<Charge-Generation Region>

The charge-generation region may have either a structure in which an electron acceptor (acceptor) is added to an organic compound with a high hole-transport property or a structure in which an electron donor (donor) is added to an organic compound with a high electron-transport property. Alternatively, these structures may be stacked.

Examples of the organic compound with a high hole-transport property include the above materials that can be used for the hole-transport layer, and examples of the organic compound with a high electron-transport property include the above materials that can be used for the electron-transport layer.

As examples of the electron acceptor, 7,7,8,8-tetracyano-2,3,5,6-tetrafluoroquinodimethane (abbreviation: F4-TCNQ), chloranil, and the like can be given. In addition, transition metal oxides can be given, among which oxides of metals belonging to Groups 4 to 8 of the periodic table are preferred. Specifically, it is preferable to use vanadium oxide, niobium oxide, tantalum oxide, chromium oxide, molybdenum oxide, tungsten oxide, manganese oxide, and rhenium oxide because of their high electron accepting properties. Among these, molybdenum oxide is especially preferable because it is stable in the air, has a low hygroscopic property, and is easy to handle.

As the electron donor, it is possible to use an alkali metal, an alkaline earth metal, a rare earth metal, a metal belonging to Group 13 of the periodic table, or an oxide or a carbonate thereof. Specifically, lithium, cesium, magnesium, calcium, ytterbium, indium, lithium oxide, cesium carbonate, or the like is preferably used. Alternatively, an organic compound such as tetrathianaphthacene may be used as the electron donor.

The above-described layers included in the EL layer 2203 and the intermediate layer 2207 can be formed by any of the following methods: an evaporation method (including a vacuum evaporation method), a transfer method, a printing method, an inkjet method, a coating method, and the like.

This embodiment can be combined with any of the other embodiments in this specification as appropriate.

Embodiment 5

In this embodiment, electronic devices including the light-emitting device of one embodiment of the present invention are described with reference to FIGS. 11A to 11C, FIGS. 12A to 12C, and FIG. 13.

The light-emitting device of one embodiment of the present invention can be used for a flash of a camera such as a digital still camera, a flash of a camera incorporated in a mobile phone (also called a cellular phone or mobile phone device) or a portable information terminal having a photography function, or the like. Alternatively, the light-emitting device of one embodiment of the present invention can be used for a light of a bicycle or a car, a beacon, illuminations for decorative purposes, or the like.

Furthermore, the light-emitting device of one embodiment of the present invention can be used for a security device, for example. Specifically, with the light-emitting device, a person intermittently emits light with directivity toward an assailant when attacked. This can make the assailant flinch and hesitate to attack.

In addition, when the light-emitting device is provided in a portable camera or a mobile phone with a camera, the light-emitting device can function as both a camera flash and a security device. Specifically, with the light-emitting device, a user can not only emit light toward an assailant to repulse the assailant but also take an image of the assailant. This can prevent crimes. Even when a crime occurs, an image taken by the light-emitting device makes it easy to identify a criminal.

When the light-emitting device of one embodiment of the present invention is used as a warning light of, for example, a bicycle, the position of the bicycle can be recognized by other vehicles, passersby, or the like. This can prevent accidents.

Figure 11A:
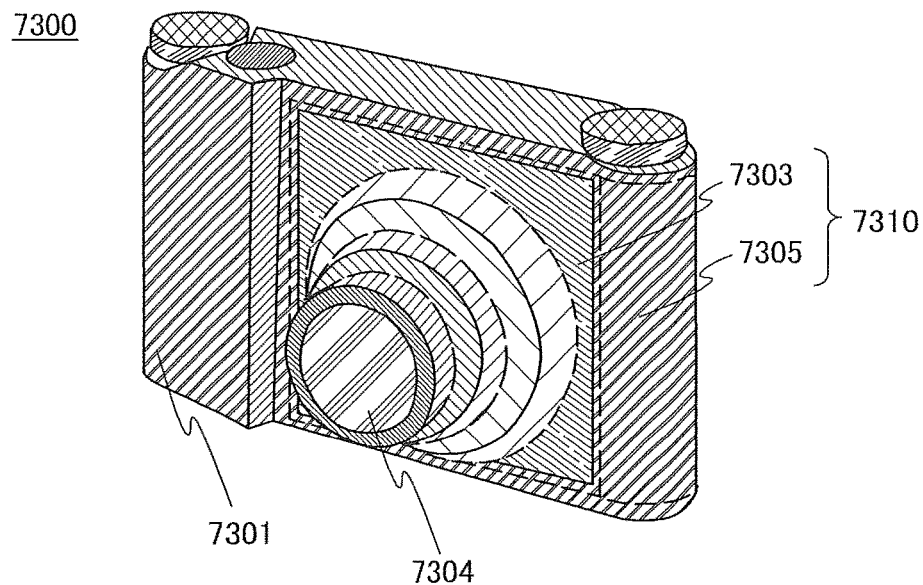
FIGS. 11A to 11C illustrate electronic devices.

FIG. 11A illustrates an example of a digital still camera. A digital still camera 7300 includes a housing 7301, a lens 7304, a light-emitting device 7310, and the like. The light-emitting device of one embodiment of the present invention is used as the light-emitting device 7310. A first light-emitting portion 7303 of the light-emitting device 7310 is located so as to surround the lens 7304. The light-emitting device of one embodiment of the present invention is flexible and can thus be curved. In the digital still camera 7300, a second light-emitting portion 7305 of the light-emitting device 7310 is bent to fit the shape of the housing 7301, which enables the first light-emitting portion 7303 to be located over a large area around the lens 7304. This can make a shadow of a nose less likely to be cast on a cheek when a photograph of a human face is taken in a dark place using a flash, for example. Note that the second light-emitting portion 7305 may be used as an indicator of operating conditions.

Figure 11B:
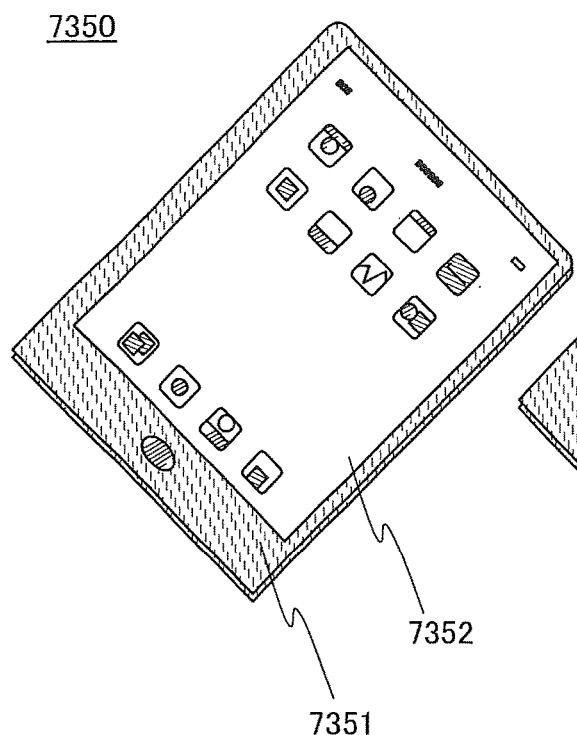
Figure 11C:
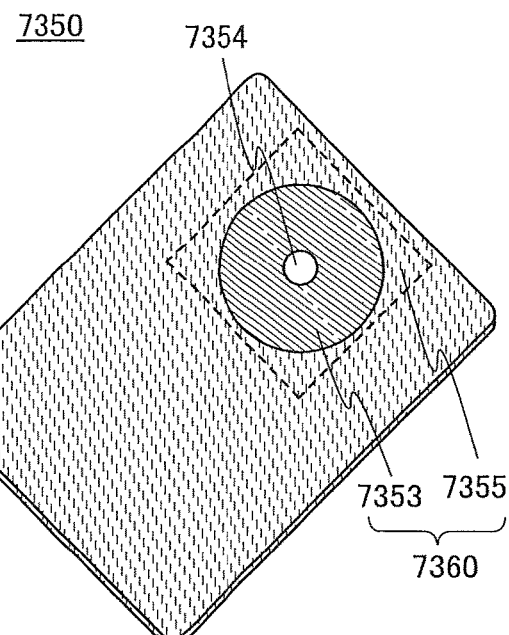

FIGS. 11B and 11C illustrate an example of a mobile phone. One side (also referred to as a front side) of a mobile phone 7350 is illustrated in FIG. 11B, and a side opposite the one side (also referred to as a back side) is illustrated in FIG. 11C.

The mobile phone 7350 includes a housing 7351, a display portion 7352, a lens 7354, a light-emitting device 7360, and the like. The light-emitting device of one embodiment of the present invention is used as the light-emitting device 7360. The light-emitting device 7360 includes a light-emitting portion 7353 and a non-light-emitting portion 7355, and the light-emitting portion 7353 is located so as to surround the lens 7354. The light-emitting portion 7353 may be used as a mirror when not emitting light.

Figure 12A:
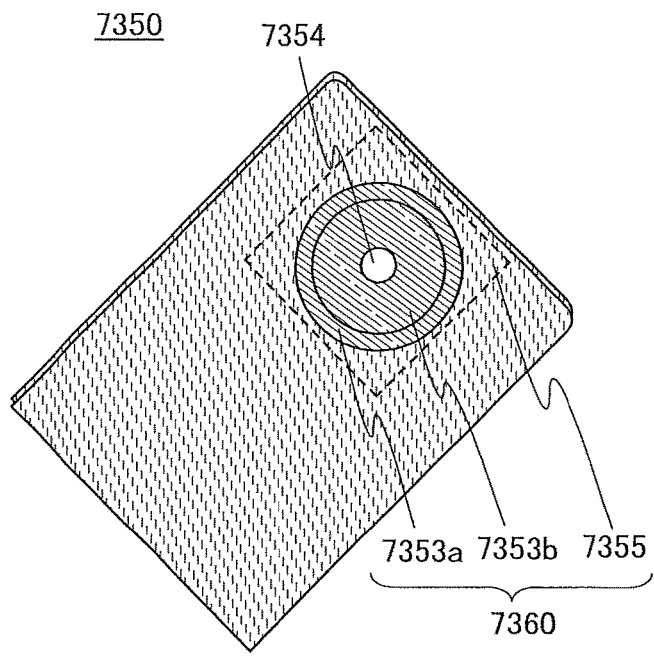
FIGS. 12A to 12C each illustrate an electronic device.

FIG. 12A illustrates a modification example of the light-emitting device 7360 of the mobile phone 7350. The light-emitting device 7360 illustrated in FIG. 12A includes two light-emitting panels 7353a and 7353b.

Figure 13:
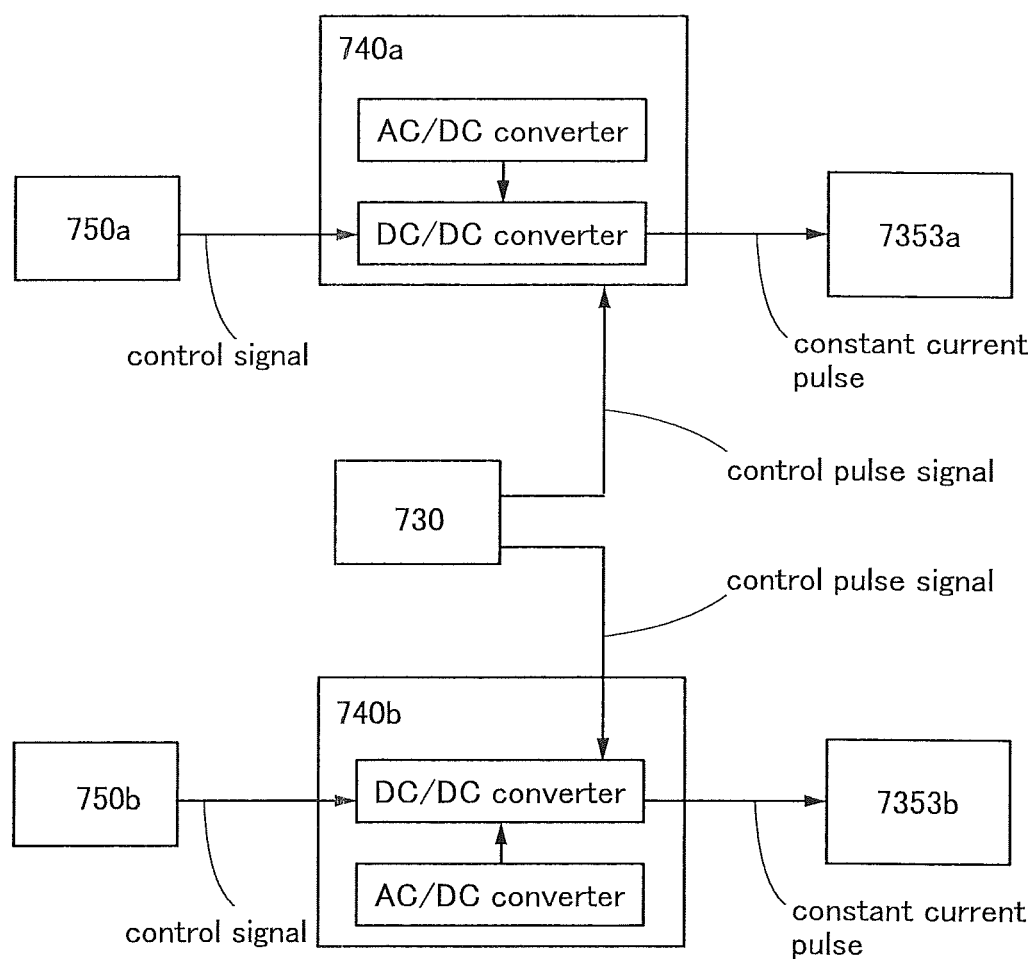
FIG. 13 illustrates a block diagram of a light-emitting device according to an embodiment.

FIG. 13 is a block diagram of the light-emitting device 7360 illustrated in FIG. 12A. The light-emitting device 7360 includes the two light-emitting panels 7353a and 7353b, a driver circuit 730, two constant current supplies 740a and 740b, and two control devices 750a and 750b.

The two control devices 750a and 750b are supplied with a signal corresponding to a condition selected by a user of the mobile phone 7350 or detection signals from a variety of sensors. Each of the control devices 750a and 750b supplies a control signal corresponding to the supplied signal or detection signal. For example, a control signal (also referred to as attachment/detachment signal) is supplied after sensing the state of attachment or detachment of the optical component.

The constant current supply 740a supplies, to the light-emitting panel 7353a, a constant current pulse corresponding to the control signal supplied by the control device 750a. The constant current supply 740b supplies, to the light-emitting panel 7353b, a constant current pulse corresponding to the control signal supplied by the control device 750b. Thus, the amount of light of the light-emitting panels 7353a and 7353b is separately adjusted. As a result, the amount of light emitted from the light-emitting device can be adjusted in a wider range, which is preferable.

The light-emitting panels 7353a and 7353b may emit light with different colors or different color temperatures. For example, in the case where the two light-emitting panels have different color temperatures, the light-emitting device can emit light with an appropriate color temperature by separately adjusting the amount of light of the light-emitting panels.

The light-emitting panels 7353a and 7353b are separately supplied with a control pulse signal by the driver circuit 730 through the constant current supplies 740a and 740b, respectively. In other words, the driver circuit 730 may supply the same control pulse signal or different control pulse signals to the light-emitting panels 7353a and 7353b.

Note that the light-emitting device 7360 may include two or more driver circuits and may include three or more light-emitting panels. The light-emitting device 7360 may include a light-emitting panel in which the amount of light cannot be adjusted.

In the light-emitting device 7360 having the structure illustrated in FIG. 13, the light-emitting panels 7353a and 7353b can emit light independently. For example, when a sufficient amount of light can be obtained from one light-emitting panel, only one of the light-emitting panels may be made to emit light, and when a larger amount of light is needed, both light-emitting panels may be made to emit light. This can reduce the power consumption of the light-emitting device and suppress deterioration of the light-emitting panels.

Figure 12B:
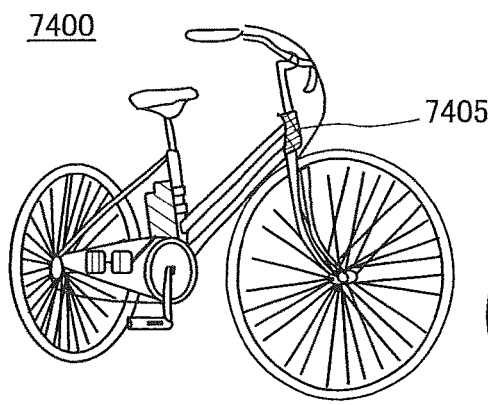

FIG. 12B illustrates an example of a bicycle. A bicycle 7400 includes a light 7405. The light 7405 includes the light-emitting device of one embodiment of the present invention.

Figure 12C:
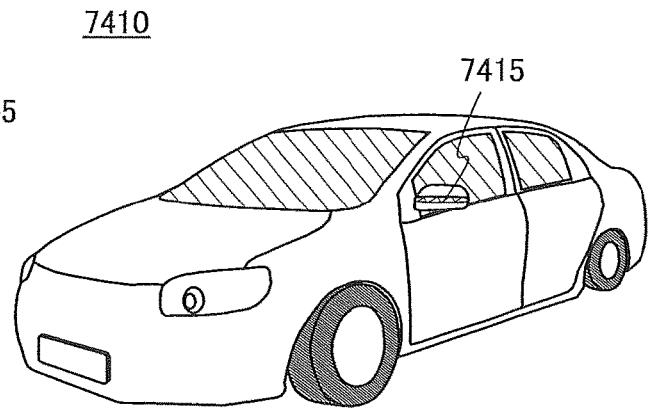

FIG. 12C illustrates an example of a car. A car 7410 includes a light 7415. The light-emitting device of one embodiment of the present invention is used for the light 7415.

In the case where the light-emitting device of one embodiment of the present invention is used for a light of a bicycle or a vehicle, after detection of the ambient brightness by an optical sensor, the following controls can be performed, for example: when the ambient brightness is sufficiently high, the light does not emit light; when the ambient brightness is sufficiently low, the light blinks; and when the ambient brightness is not sufficiently high but light is detected, the light blinks and the amount of light emitted from the light is increased. Thus, the light-emitting device of one embodiment of the present invention can emit an optimum amount of light, and a light with low power consumption can be achieved.

This embodiment can be combined with any of the other embodiments in this specification as appropriate.

Embodiment 6

In this embodiment, a structure of a light-emitting device of one embodiment of the present invention is described with reference to FIG. 14 and FIGS. 18A to 18C.

Figure 14:
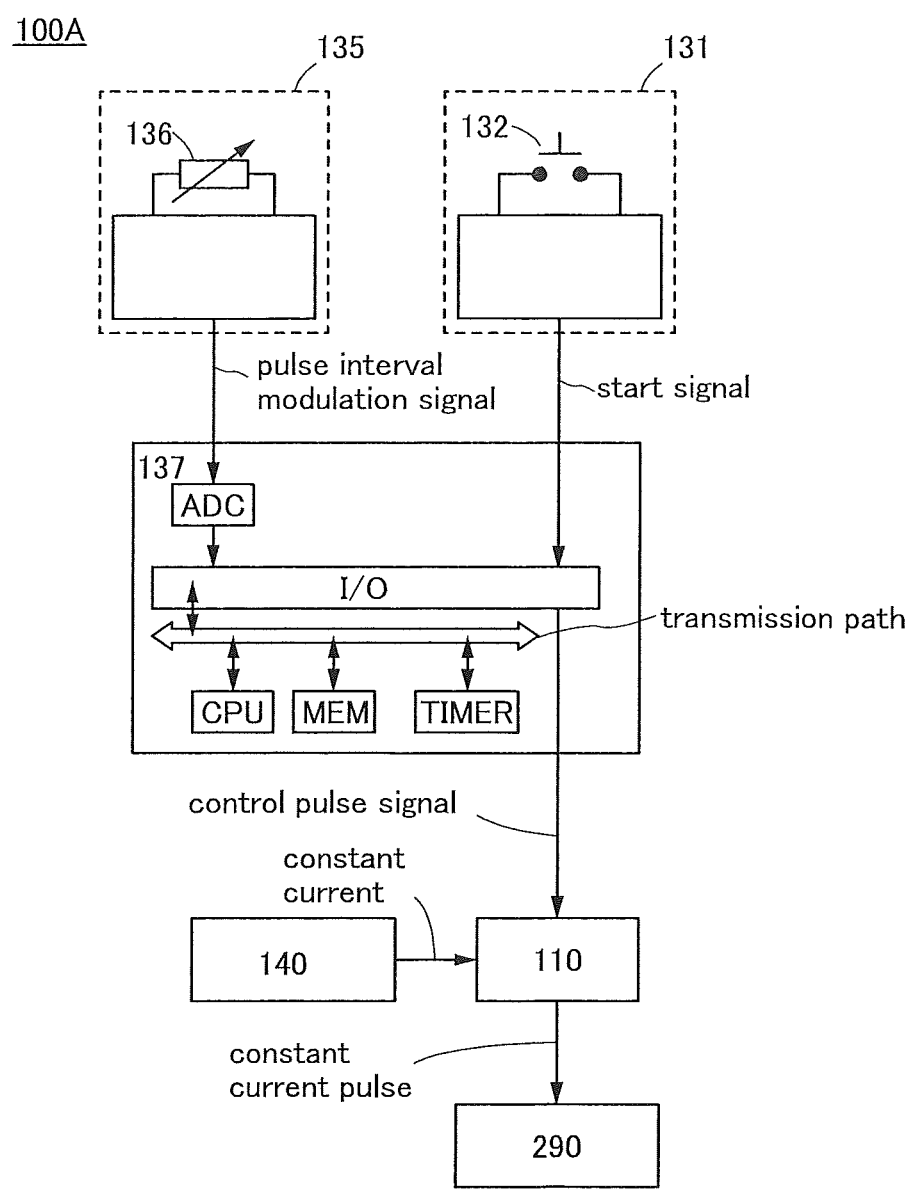
FIG. 14 is a block diagram illustrating a structure of a light-emitting device according to an embodiment.

FIG. 14 is a block diagram illustrating a configuration of a light-emitting device of one embodiment of the present invention.

Figure 18A:
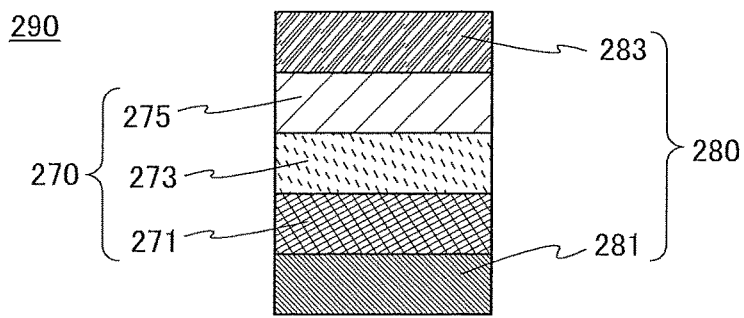
FIGS. 18A to 18C are schematic views illustrating structures of a light-emitting device according to embodiments.
Figure 18B:
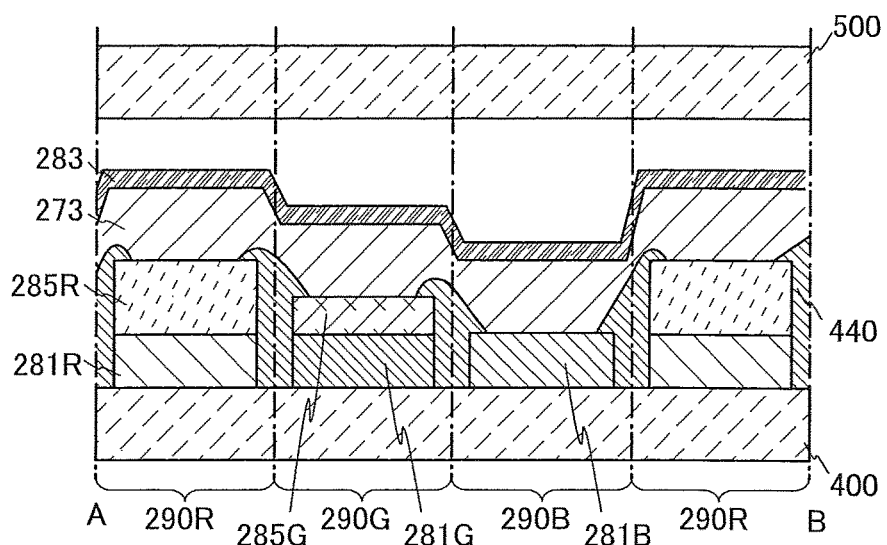
Figure 18C:
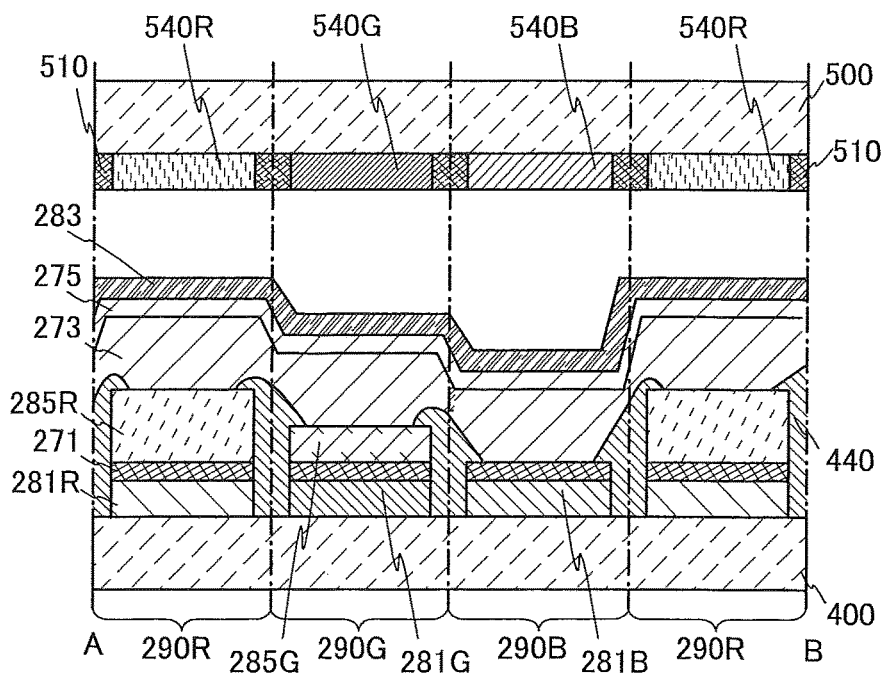

FIGS. 18A to 18C are schematic views illustrating structures of a light-emitting module which can be used for a light-emitting device of one embodiment of the present invention.

<Structural Example 1 of Light-Emitting Device>

A light-emitting device 100A described in this embodiment includes the start switch circuit 131 that supplies the start signal; the microcontroller 137 that is supplied with the start signal and supplies the control pulse signal; the switching circuit 110 that is supplied with the control pulse signal and the constant current and supplies the constant current pulse; the constant current supply 140 that supplies the constant current; and a light-emitting module 290 that is supplied with the constant current pulse and emits pulsed light.

The light-emitting module 290 includes a light-emitting element 270 and a microresonator 280 that sandwiches the light-emitting element 270 and emits light from one side of the microresonator 280 (see FIG. 18A). The light-emitting element 270 includes a lower electrode 271; an upper electrode 275 overlapping with the lower electrode 271; and a layer containing a light-emitting organic compound (e.g., an EL layer 273), between the lower electrode 271 and the upper electrode 275. The microresonator 280 includes a reflective film 281 and a semi-transmissive and semi-reflective film 283 overlapping with the reflective film 281. Thus, the light-emitting module can emit pulsed light having directivity.

The light-emitting device 100A described in this embodiment includes the pulse interval modulation circuit 135 that supplies the pulse interval modulation signal. The microcontroller 137 is supplied with the pulse interval modulation signal.

Components of the light-emitting device 100A are described below. Note that explanation is given for the structures which are different from those of the light-emitting device 200 of Embodiment 1 and the above description is referred to for the similar structures.

<<Switching Circuit>>

The switching circuit 110 supplies the constant current pulse to the light-emitting module 290 while being supplied with the constant current and the control pulse signal.

<<Constant Current Supply>>

Figure 16A:
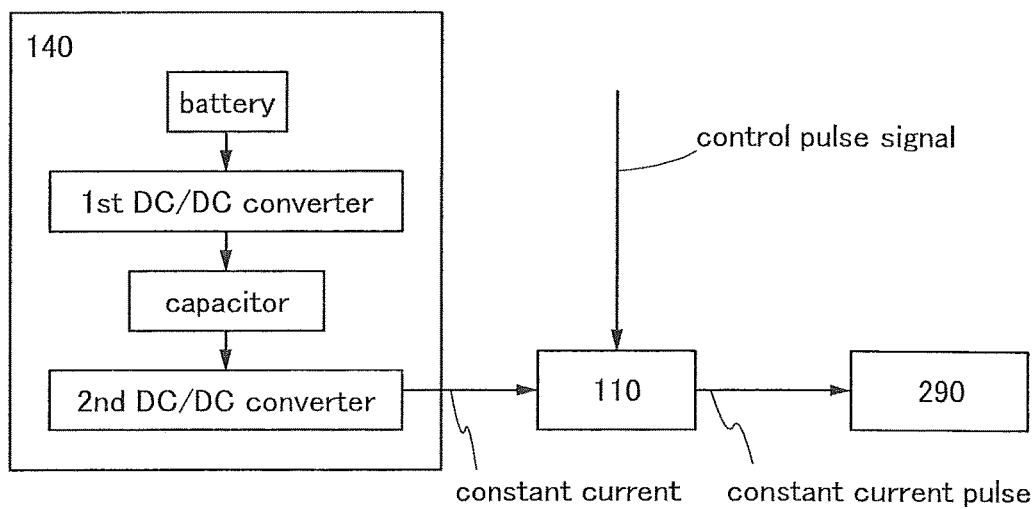
FIGS. 16A and 16D illustrate a structure for generating a constant current pulse according to embodiments.
Figure 16B:
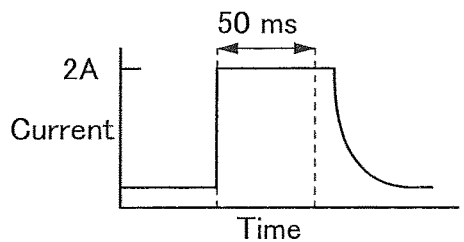
FIGS. 16B and 16C illustrate the constant current pulse.
Figure 16C:
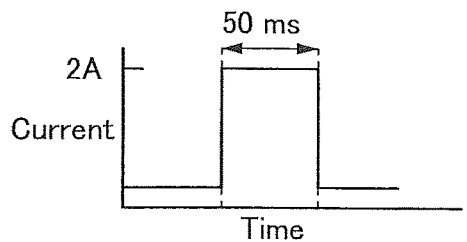

The constant current supply 140 can have the same structures as the constant current supply 140 of the light-emitting device of Embodiment 1 (see FIG. 16A). The examples of the change over time of the current supplied by the constant current supply 140 and the switching circuit 110 are also the same as those of Embodiment 1 (see FIGS. 16B and 16C).

<<Light-Emitting Module>>

The light-emitting module including the microresonator emits light having directivity. Note that a structure of the light-emitting module which can be used for the light-emitting device 100A is described in Embodiment 7.

<Structural Example 2 of Light-Emitting Device>

Another structure of the light-emitting device of one embodiment of the present invention is described with reference to FIG. 15.

Figure 15:
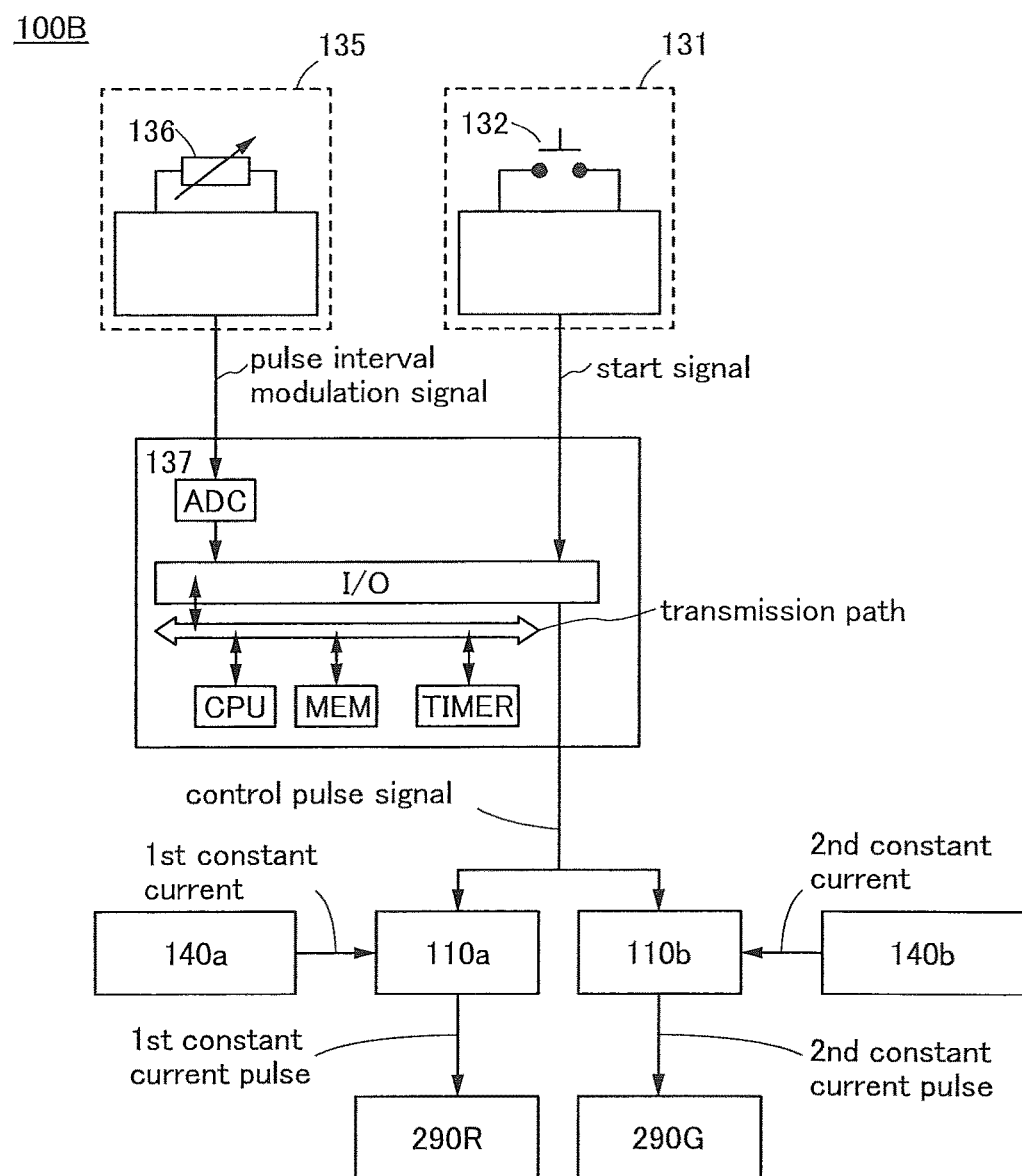
FIG. 15 is a block diagram illustrating a structure of a light-emitting device according to an embodiment.

FIG. 15 is a block diagram illustrating another structure of the light-emitting device of one embodiment of the present invention.

A light-emitting device 100B is different from the light-emitting device 100A described with reference to FIG. 14 in having a plurality of switching circuits (110a and 110b) supplied with the control pulse signal, a plurality of constant current supplies (140a and 140b), and a plurality of light-emitting modules (290R and 290G). Parts different from those in FIG. 14 are described in detail below, and the above description is referred to for the other similar parts.

The light-emitting device 100B described in this embodiment includes the start switch circuit 131 that supplies the start signal; the microcontroller 137 that is supplied with the start signal and supplies the control pulse signal; the first switching circuit 110a that is supplied with the control pulse signal and first constant current and supplies the first constant current pulse; the second switching circuit 110b that is supplied with the control pulse signal and second constant current and supplies a second constant current pulse; the first constant current supply 140a that supplies the first constant current; the first light-emitting module 290R that is supplied with the first constant current pulse; the second constant current supply 140b that supplies the second constant current; and the second light-emitting module 290G that is supplied with the second constant current pulse.

The second light-emitting module 290G emits light of color different from color of light emitted from the first light-emitting module 290R.

The first light-emitting module 290R and the second light-emitting module 290G each include a light-emitting element and a microresonator for sandwiching the light-emitting element and emitting light from one side of the microresonator (FIG. 18B).

A light-emitting element of the first light-emitting module 290R includes an optical adjustment layer 285R serving as a lower electrode, the semi-transmissive and semi-reflective film 283 overlapping with the lower electrode and serving as an upper electrode, and the layer containing a light-emitting organic compound (the EL layer 273) between the lower electrode and the upper electrode. The microresonator includes a reflective film 281R and the semi-transmissive and semi-reflective film 283 overlapping with the reflective film 281R.

A light-emitting element of the second light-emitting module 290G includes an optical adjustment layer 285G serving as a lower electrode, the semi-transmissive and semi-reflective film 283 overlapping with the lower electrode and serving as an upper electrode, and the layer containing a light-emitting organic compound (the EL layer 273) between the lower electrode and the upper electrode. The microresonator includes a reflective film 281G and the semi-transmissive and semi-reflective film 283 overlapping with the reflective film 281G.

In the light-emitting device 100B, the plurality of switching circuits (110a and 110b) can supply the same amount or different amounts of constant current pulses. Thus, pulsed light having different colors and having directivity can be emitted at different intensities.

Components of the light-emitting device 100B that are different from those of the light-emitting device 100A are described.

<<First Switching Circuit and Second Switching Circuit>>

A structure that can be used for the switching circuit 110 of the light-emitting device 100A can be used for the first switching circuit 110a and the second switching circuit 110b.

The first switching circuit 110a and the second switching circuit 110b are supplied with the control pulse signal from the microcontroller 137 at the same time.

The first switching circuit 110a supplies a constant current pulse whose intensity is the same as that of constant current supplied from the first constant current supply 140a, and the second switching circuit 110b supplies a constant current pulse whose intensity is the same as that of constant current supplied from the second constant current supply 140b. The first switching circuit 110a and the second switching circuit 110b supply the constant current pulses at the same time.

<<First Constant Current Supply and Second Constant Current Supply>>

A structure that can be used for the constant current supply 140 of the light-emitting device 100A can be used for the first constant current supply 140a and the second constant current supply 140b.

The second constant current supply 140b can supply constant current whose amount is the same as or different from that of constant current supplied from the first constant current supply 140a.

<<First Light-Emitting Module and Second Light-Emitting Module>>

A structure which can be used for the light-emitting module 290 of the light-emitting device 100A can be used for the first light-emitting module 290R and the second light-emitting module 290G.

The second light-emitting module 290G and the first light-emitting module 290R emit light of different colors.

For example, the distance between the reflective film 281G and the semi-transmissive and semi-reflective film 283 of the microresonator of the second light-emitting module 290G can be made different from the distance between the reflective film 281R and the semi-transmissive and semi-reflective film 283 of the microresonator of the first light-emitting module 290R. Specifically, the thickness of the optical adjustment layer 285G of the second light-emitting module 290G can be made different from the thickness of the optical adjustment layer 285R of the first light-emitting module 290R.

As another example, the light-emitting element of the second light-emitting module 290G and the light-emitting element of the first light-emitting module 290R can emit light of different colors. Specifically, a layer containing a light-emitting organic compound of the light-emitting element of the second light-emitting module 290G can be made different from a layer containing a light-emitting organic compound of the light-emitting element of the first light-emitting module 290R.

<Structural Example 3 of Light-Emitting Device>

Figure 16D:
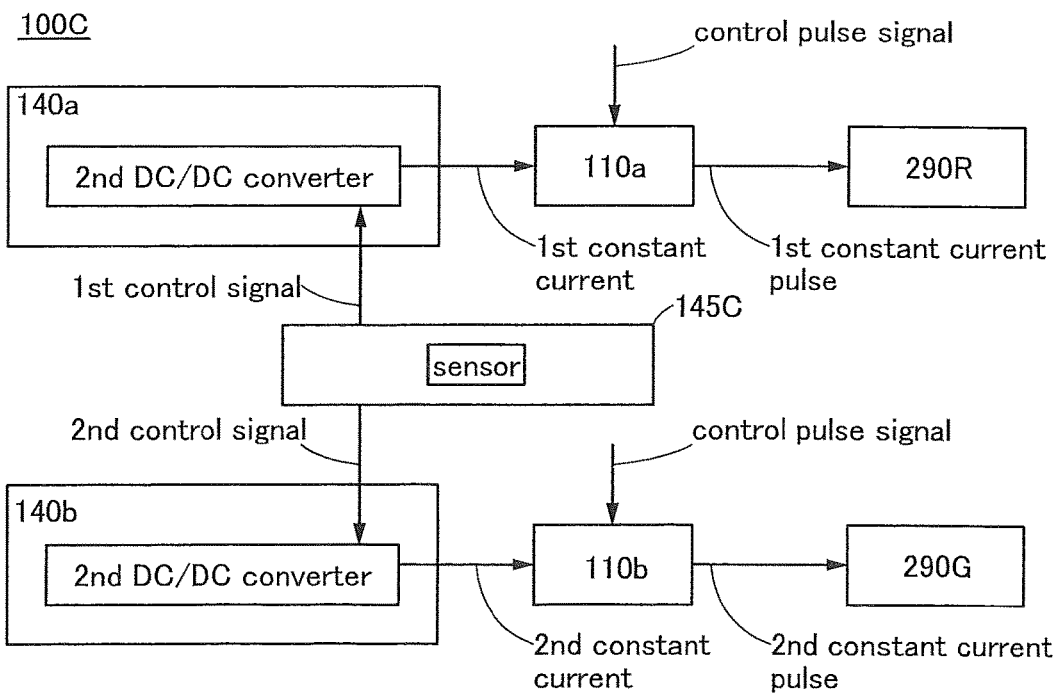

A structure of a light-emitting device 100C of one embodiment of the present invention is described with reference to FIG. 16D. Note that FIG. 16D is a block diagram illustrating a portion of a structure of the light-emitting device 100C that is different from that of the light-emitting device 100B.

The light-emitting device 100C is different from the light-emitting device 100B described with reference to FIG. 15 in the following points: a control circuit 145C for supplying the control signal is provided; and the amount of constant current is controlled and the constant current is supplied from the first constant current supply 140a and the second constant current supply 140b in accordance with the control signal. Parts different from those in FIG. 15 are described in detail below, and the above description is referred to for the other similar parts.

The light-emitting device 100C includes the control circuit 145C for supplying a first control signal and a second control signal, in addition to the structure of the light-emitting device 100B.

The control circuit 145C includes a sensor for supplying a sense signal and supplies the first control signal and the second control signal in accordance with the sense signal.

The first constant current supply 140a is supplied with the first control signal and controls the amount of the first constant current in accordance with the first control signal. The second constant current supply 140b is supplied with the second control signal and controls the amount of the second constant current in accordance with the second control signal.

Thus, pulsed light having directivity and having different colors can be emitted in accordance with the sensor signal supplied from the sensor that senses the environment or the like.

<<Control Circuit>>

The control circuit 145C senses the environment in which the light-emitting device 100C is used and supplies the control signal.

For example, an optical sensor, a distance sensor, or the like can be used for the sensor. The optical sensor can sense the brightness of an environment or measure a spectrum, or the like. The distance sensor can sense the distance to an object (e.g., a photographic subject when the distance sensor is used together with a camera) to which light is emitted from the light-emitting device.

Specifically, in the case where the wavelength region provided by the first light-emitting module is deficient in the environment light, the control circuit 145C supplies the control signal to the first constant current supply 140a to amplify the current. Thus, light insufficient in the environment can be compensated using the first light-emitting module.

Furthermore, the light-emitting device 100C and the imaging device can be used in combination, which enables imaging of the photographic subject irradiated with pulsed light whose hue, color temperature, or the like is adjusted. In particular, the environment in which the imaging device is used is measured by the sensor included in the control circuit 145C to control color of pulsed light emission (also referred to as flash) in each light-emitting module. Thus, light can be emitted so that light in the environment where the imaging device is used can be compensated or specific light can be enhanced.

Specifically, in a first step, a component of light in the environment is analyzed by the optical sensor. In a second step, the control signal for correcting the analysis result is generated or obtained from a lookup table. In a third step, the constant current pulse is generated from the constant current supplied by the constant current supply supplied with the control signal, so that pulsed light is emitted. Concurrently, imaging is performed using the imaging unit.

Furthermore, the memory circuit that stores the use history of the light-emitting module 290 may be used for the control circuit to estimate the degree of degradation of the light-emitting module 290. Thus, the amount of current to be supplied from the constant current supply 140 can be controlled. Specifically, the amount of constant current can be increased to compensate a decrease in luminance due to use of the light-emitting module 290.

This embodiment can be combined with any of the other embodiments in this specification as appropriate.

Embodiment 7

In this embodiment, a structure of a light-emitting module which can be used for the light-emitting device of one embodiment of the present invention will be described with reference to FIGS. 18A to 18C, FIG. 19, FIG. 20, FIG. 21, FIGS. 22A and 22B, FIG. 23, and FIGS. 24A to 24C.

The light-emitting device of one embodiment of the present invention includes a light-emitting module that is supplied with the constant current pulse and emits the pulsed light. The light-emitting module includes the light-emitting element and the microresonator that sandwiches the light-emitting element and emits light from one side of the microresonator. The light-emitting element includes the lower electrode, the upper electrode overlapping with the lower electrode, and the layer containing a light-emitting organic compound which is provided between the lower electrode and the upper electrode. The microresonator includes the reflective film and the semi-transmissive and semi-reflective film overlapping with the reflective film.

The microresonator in the light-emitting element induces interference of light emitted from the light-emitting element occurs, so that light of a specific color can be efficiently extracted. That is, light having a specific wavelength range can be preferentially extracted. Even in the case where a light-emitting element showing Lambertian emission is incorporated, the use of the microresonator allows the emission of light with directivity.

When a flexible light-emitting panel including the light-emitting module having the microresonator is bent with a light emission side recessed, condensed pulsed light can be emitted.

Note that the structure of the light-emitting element described in Embodiment 4 can be used for a part of the light-emitting element of this embodiment.

The light-emitting device of one embodiment of the present invention may include a plurality of light-emitting modules. The plurality of light-emitting modules may emit light of different colors. Alternatively, the plurality of light-emitting modules may emit light of the same color.

The total area of a light-emitting portion of the light-emitting panel including one or a plurality of light-emitting modules is, for example, greater than or equal to 0.5 cm$^2$ and less than or equal to 1 m$^2$, preferably greater than or equal to 5 cm$^2$ and less than or equal to 200 cm$^2$, more preferably greater than or equal to 15 cm$^2$ and less than or equal to 100 cm$^2$. Note that a light-emitting portion having a large area can increase the total amount of light emitted in a pulsed manner.

In the light-emitting panel including the organic EL element, the density of current flowing in the light-emitting element in an emission state can be greater than or equal to 10 mA/cm$^2$ and less than or equal to 2000 mA/cm$^2$, for example. Note that by reducing the current density, generation of heat in the light-emitting element due to emission of pulsed light can be suppressed.

<<Light-Emitting Module>>

The light-emitting module 290 illustrated in FIG. 18A includes the light-emitting element 270 and the microresonator 280. The light-emitting element 270 includes the lower electrode 271, the EL layer 273, and the upper electrode 275. The microresonator 280 includes the reflective film 281 and the semi-transmissive and semi-reflective film 283.

Note that the reflective film or the semi-transmissive and semi-reflective film of the microresonator may also serve as the electrode of the light-emitting element.

Note that in this specification, the reflective film refers to a film which reflects part of incident light and does not transmit the incident light, and the semi-transmissive and semi-reflective film refers to a film which transmits and reflects part of incident light. The semi-transmissive and semi-reflective film used for the microresonator preferably absorbs less light.

For example, the reflective film can be formed using a metal film, specifically, aluminum, silver, gold, platinum, copper, an alloy containing aluminum (e.g., an aluminum-titanium alloy or an aluminum-neodymium alloy), an alloy containing silver (a silver-neodymium alloy), an alloy containing silver (a magnesium-silver alloy), and the like. For the semi-transmissive and semi-reflective film, a film having a thickness greater than or equal to 0.1 nm and less than 100 nm and including a material similar to that of the reflective film can be used. Specifically, silver, an alloy of silver and magnesium (Mg—Ag alloy), and the like are preferable because they each have a work function suitable for carrier injection as well as capability of giving a uniform thin film.

The wavelength of extracted light depends on the distance between the reflective film and the semi-transmissive and semi-reflective film. Thus, an optical adjustment layer for adjusting the distance between the reflective film and the semi-transmissive and semi-reflective film is provided in the light-emitting element.

A conductive film having a light-transmitting property to visible light or a layer included in an EL layer can be employed for a material that can be used for the optical adjustment layer.

For example, a stacked-layer film including a conductive film having a light-transmitting property and a reflective film, or a stacked-layer film including a conductive film having a light-transmitting property and a semi-transmissive and semi-reflective film can be used as a lower electrode or an upper electrode which also serves as the optical adjustment layer.

An intermediate layer whose thickness is adjusted (as for the intermediate layer, see Embodiment 4) may be used as the optical adjustment layer. The electric resistance of the intermediate layer is lower than that of the layer included in the EL layer. Thus, even if the thickness is increased for optical adjustment, this structure is preferable because an increase in driving voltage of a light-emitting element can be suppressed.

Figure 21:
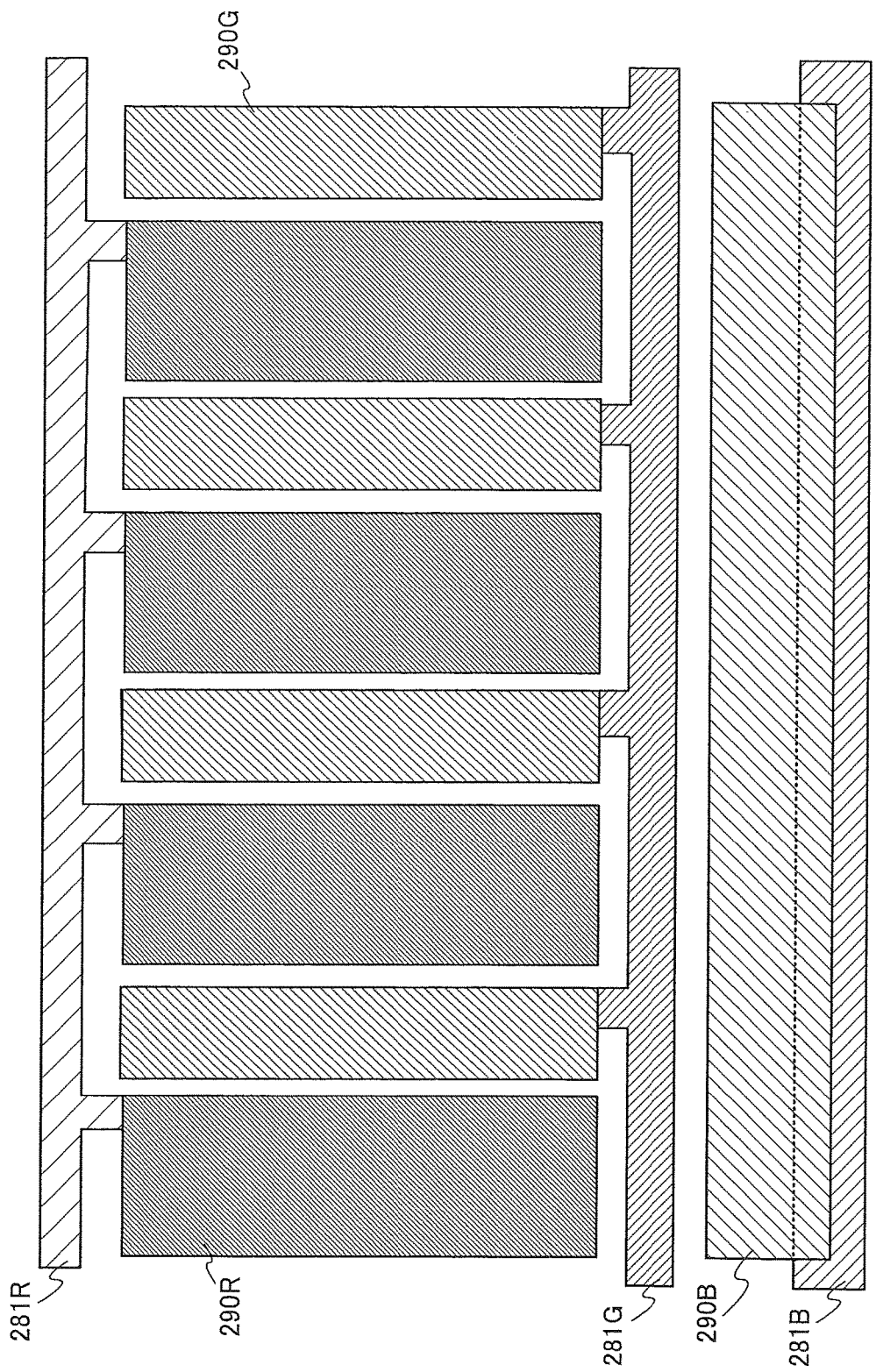
FIG. 21 is a top view illustrating a structure of a light-emitting panel of a light-emitting device according to an embodiment.

FIGS. 19 to 21 are each a plan view of a light-emitting panel including a substrate over which three light-emitting modules emitting light of different colors are provided. In FIGS. 19 to 21, some components such as the upper electrode 275 are not shown.

FIGS. 19 to 21 each show an example in which the light-emitting modules emitting light of the same color are connected by one reflective film; however, one embodiment of the present invention is not limited thereto.

The light-emitting areas of the light-emitting modules may be the same as illustrated in FIG. 19, or may be different from each other as illustrated in FIGS. 20 and 21 depending on emission color. For example, as illustrated in FIG. 20, the light-emitting area of the light-emitting module 290B emitting light of blue color with low luminosity factor may be the largest, and the light-emitting area of the second light-emitting module 290G emitting light of green color with high luminosity factor may be small. The number of light-emitting modules with different emission color may be the same as one another as shown in FIGS. 19 and 20 or different from one another as shown in FIG. 21. FIG. 21 shows an example in which a plurality of first light-emitting modules 290R emitting light of red color and a plurality of second light-emitting modules 290G emitting light of green color are provided whereas a single number of a third light-emitting module 290B emitting light of blue color is provided.

FIG. 18B shows an example of a cross-sectional view taken along dashed-dotted line A-B in FIG. 19.

The light-emitting panel illustrated in FIG. 18B includes, between a substrate 400 and a substrate 500, the first light-emitting module 290R, the second light-emitting module 290G, and the third light-emitting module 290B.

The first light-emitting module 290R includes the reflective film 281R, the optical adjustment layer 285R, the EL layer 273, and the semi-transmissive and semi-reflective film 283. The constant current pulse is supplied to the reflective film 281R. The optical adjustment layer 285R is a conductive film having a light-transmitting property with respect to visible light and also serves as the lower electrode. The semi-transmissive and semi-reflective film 283 also serves as the upper electrode.

The second light-emitting module 290G includes the reflective film 281G, the optical adjustment layer 285G, the EL layer 273, and the semi-transmissive and semi-reflective film 283. The constant current pulse is supplied to the reflective film 281G. The optical adjustment layer 285G is a conductive film having a light-transmitting property with respect to visible light and also serves as the lower electrode. The semi-transmissive and semi-reflective film 283 also serves as the upper electrode.

The third light-emitting module 290B includes the reflective film 281B, the EL layer 273, and the semi-transmissive and semi-reflective film 283. The constant current pulse is supplied to the reflective film 281B. The reflective film 281B is a conductive film having a light-reflecting property with respect to visible light and also serves as the lower electrode. The semi-transmissive and semi-reflective film 283 also serves as the upper electrode.

The semi-transmissive and semi-reflective film 283 that also serves as the upper electrode is a continuous conductive film and overlaps with a plurality of lower electrodes. Note that the semi-transmissive and semi-reflective film 283 may be divided into a plurality of parts, and the divided semi-transmissive and semi-reflective films 283 may each overlap with one or a plurality of lower electrodes.

A partition wall 440 is provided between adjacent light-emitting elements. The partition wall 440 is a layer having an insulating property that covers an end portion of the lower electrode and includes an opening overlapping with the lower electrode.

Note that using a material absorbing visible light for the partition wall 440 produces an effect of suppressing light leakage from a light-emitting element into its adjacent light-emitting element (also called optical crosstalk).

FIG. 18C shows another example of a cross-sectional view taken along dashed-dotted line A-B in FIG. 19.

The light-emitting panel illustrated in FIG. 18C includes, between the substrate 400 and the substrate 500, the first light-emitting module 290R, the second light-emitting module 290G, and the third light-emitting module 290B.

The first light-emitting module 290R includes the reflective film 281R, the lower electrode 271, the optical adjustment layer 285R, the EL layer 273, the upper electrode 275, the semi-transmissive and semi-reflective film 283, and a red coloring layer 540R. The constant current pulse is supplied to the reflective film 281R.

The second light-emitting module 290G includes the reflective film 281G, the lower electrode 271, the optical adjustment layer 285G, the EL layer 273, the upper electrode 275, the semi-transmissive and semi-reflective film 283, and a green coloring layer 540G. The constant current pulse is supplied to the reflective film 281G.

The third light-emitting module 290B includes the reflective film 281B, the lower electrode 271, the EL layer 273, the upper electrode 275, the semi-transmissive and semi-reflective film 283, and a blue coloring layer 540B. The constant current pulse is supplied to the reflective film 281B.

In each light-emitting module illustrated in FIG. 18C, a coloring layer (color filter) is provided on the light extraction side of the light-emitting element. The color filter can absorb unnecessary light. Furthermore, a light-blocking layer 510 is provided between the coloring layers.

Next, a structure of a light-emitting panel including a light-emitting module is described with reference to FIGS. 22A and 22B, FIG. 23, and FIGS. 24A to 24C.

<<Structure Example 1 of Light-Emitting Panel>>

Figure 22A:
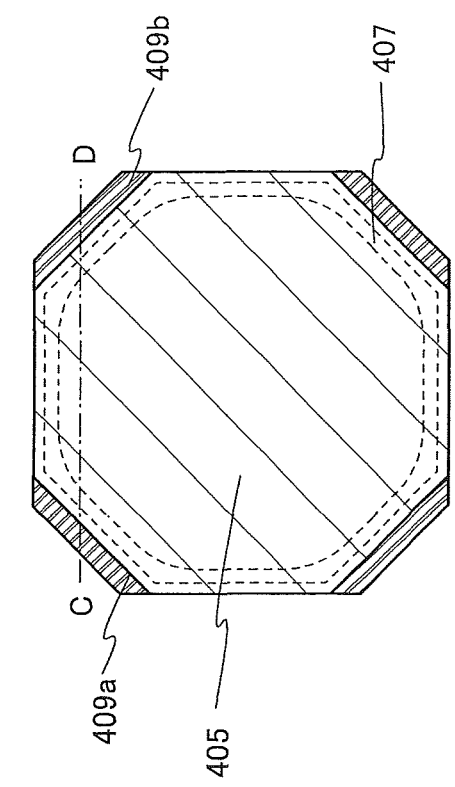
FIGS. 22A and 22B are a top view and a cross-sectional view illustrating a structure of a light-emitting panel of a light-emitting device according to an embodiment.
Figure 22B:
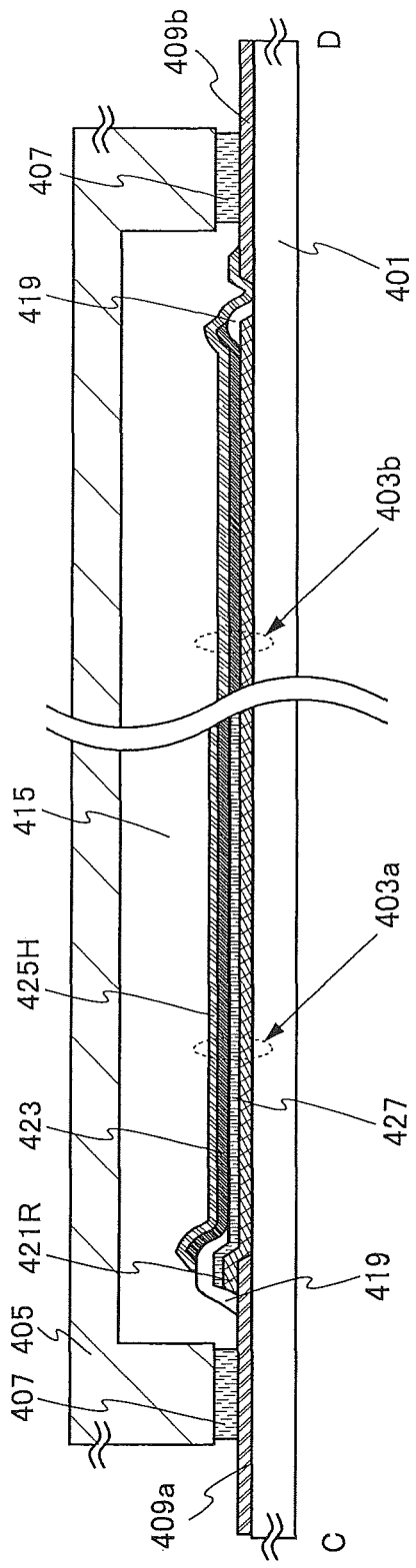

FIG. 22A is a plan view illustrating a light-emitting panel of one embodiment of the present invention, and FIG. 22B is a cross-sectional view taken along dashed-dotted line C-D in FIG. 22A.

The light-emitting panel illustrated in FIGS. 22A and 22B includes a light-emitting module 403a and a light-emitting module 403b emitting light of color different from that of light emitted from the light-emitting module 403a, in the space 415 surrounded by the support substrate 401, the sealing substrate 405, and the sealant 407.

The light-emitting module 403a includes a light-emitting element having a top-emission structure. Specifically, a reflective film 421R is provided over the support substrate 401, an optical adjustment layer 427 that also serves as a lower electrode is provided over the reflective film 421R, the EL layer 423 is provided over the optical adjustment layer 427, and a semi-transmissive and semi-reflective film 425H that also serves as an upper electrode is provided over the EL layer 423.

The light-emitting module 403b includes a light-emitting element having a top-emission structure. Specifically, the reflective film 421R that also serves as a lower electrode is provided over the support substrate 401, the EL layer 423 is provided over the reflective film 421R, and the semi-transmissive and semi-reflective film 425H that also serves as an upper electrode is provided over the EL layer 423.

The reflective film 421R is a conductive film having a reflecting property with respect to visible light. The optical adjustment layer 427 is a conductive film having a light-transmitting property with respect to visible light.

The structure of the light-emitting module used in one embodiment of the present invention is not limited to the top-emission structure and may be a bottom-emission structure, for example.

The first terminal 409a is electrically connected to the reflective film 421R. The first terminal 409a is electrically insulated from the semi-transmissive and semi-reflective film 425H by the insulating layer 419. The second terminal 409b is electrically connected to the semi-transmissive and semi-reflective film 425H. The second terminal 409b is electrically insulated from the reflective film 421R by the insulating layer 419.

<<Structure Example 2 of Light-Emitting Panel>>

Figure 23:
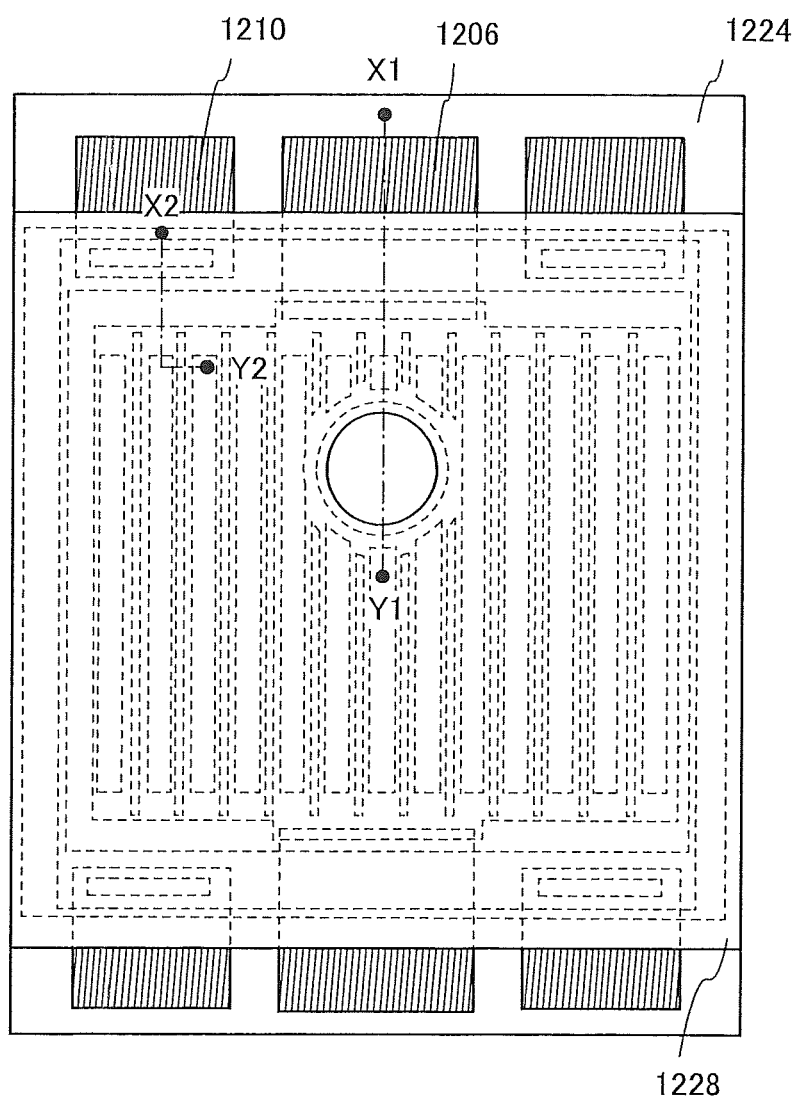
FIG. 23 is a top view illustrating a structure of a light-emitting panel of a light-emitting device according to an embodiment.
Figure 24A:
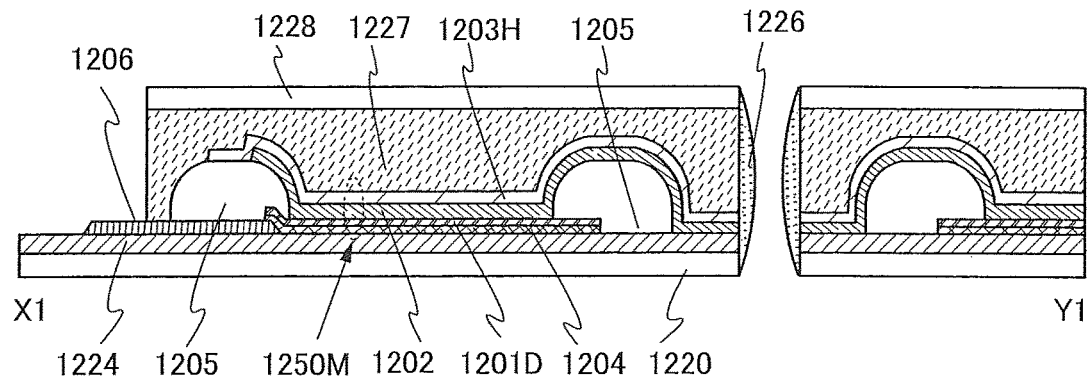
FIGS. 24A to 24C are cross-sectional views illustrating structures of a light-emitting panel of a light-emitting device according to embodiments.
Figure 24B:
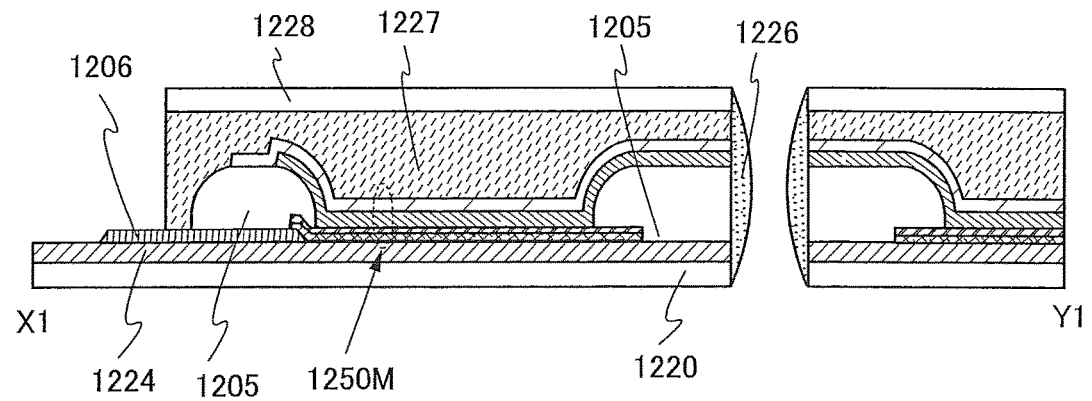
Figure 24C:
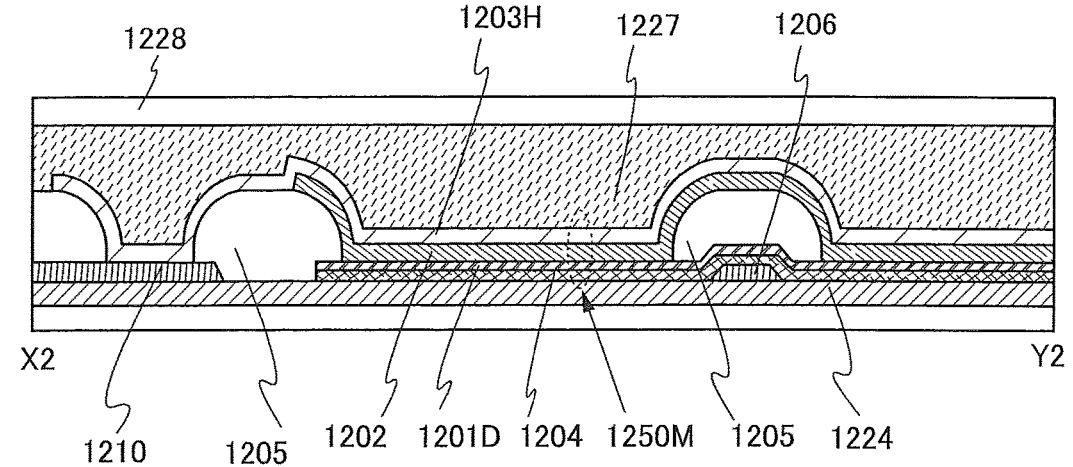

FIG. 23 is a plan view illustrating a light-emitting panel of one embodiment of the present invention. FIGS. 24A and 24B are each an example of a cross-sectional view taken along dashed-dotted line X1-Y1 in FIG. 23. FIG. 24C is a cross-sectional view taken along dashed-dotted line X2-Y2 in FIG. 23.

In the light-emitting panel illustrated in FIG. 24A, a light-emitting module 1250M is provided over the support substrate 1220 with the insulating film 1224 provided therebetween. The auxiliary wiring 1206 is provided over the insulating film 1224 and is electrically connected to an optical adjustment layer 1201D and a reflective film 1204. The auxiliary wiring 1206 is partly exposed and functions as a terminal. End portions of the optical adjustment layer 1201D, the reflective film 1204, and the conductive layer 1210 are covered with the partition wall 1205. The partition wall 1205 covers the auxiliary wiring 1206 with the optical adjustment layer 1201D and the reflective film 1204 provided therebetween. The light-emitting module 1250M is sealed with the support substrate 1220, the sealing substrate 1228, and the sealant 1227. A flexible light-emitting panel can be obtained by using flexible substrates as the support substrate 1220 and the sealing substrate 1228.

The light-emitting module 1250M includes a light-emitting element having a top-emission structure. Specifically, the reflective film 1204 is provided over the support substrate 1220, the optical adjustment layer 1201D is provided over the reflective film 1204, the EL layer 1202 is provided over the optical adjustment layer 1201D, and a semi-transmissive and semi-reflective film 1203H is provided over the EL layer 1202. The reflective film 1204 is a conductive film having a reflecting property with respect to visible light. The optical adjustment layer 1201D is a conductive film that also serves as the lower electrode and has a light-transmitting property with respect to visible light. The semi-transmissive and semi-reflective film 1203H also serves as the upper electrode.

As illustrated in FIGS. 24A and 24B, the light-emitting panel preferably includes the sealant 1226 in the opening to prevent the electrode or the EL layer from being exposed. Specifically, an opening is formed in the light-emitting panel, and then the sealant 1226 is formed to at least cover an exposed electrode and an exposed EL layer. The sealant 1226 may be the same material as or a different material from the sealant 1227.

FIG. 24A illustrates an example of an opening formed in a region where the partition wall 1205 is not provided. FIG. 24B illustrates an example of an opening formed in a region where the partition wall 1205 is provided.

Note that the opening may be formed by irradiation with a laser beam. In that case, it is desirable that a short-circuit between the electrode serving as a cathode and the electrode serving as an anode not occur. Thus, for example, it is desirable that the electrode serving as a cathode and the electrode serving as an anode not overlap with each other in the opening and in the vicinity of the opening. That is, it is desirable that the electrode serving as a cathode and/or the electrode serving as an anode not overlap with the opening. FIGS. 24A and 24B show an example of such a case. Note that one embodiment of the present invention is not limited thereto.

A camera lens is provided to overlap with the opening of the light-emitting panel, whereby a light-emitting portion can be provided around the camera lens. The light-emitting portion can be used as a flash of a camera.

Note that the sealing substrate 1228 may include an outcoupling structure. The outcoupling structure can improve the light extraction efficiency of the light-emitting panel.

Note that the application of the method outlined in Embodiment 3 allows the formation of a flexible light-emitting panel <<Materials of Light-Emitting Panel>>

Examples of materials that can be used for the light-emitting panel of one embodiment of the present invention are described.

Note that a material similar to that described in Embodiment 3 can be used for the substrate, the insulating film, the partition wall, the auxiliary wiring, or the sealant. A structure similar to the outcoupling structure described in Embodiment 3 can be used for the outcoupling structure.

[Coloring Layer and Light-Blocking Layer]

The coloring layer transmits light in a specific wavelength range. For example, a red (R) color filter for transmitting light in a red wavelength range, a green (G) color filter for transmitting light in a green wavelength range, a blue (B) color filter for transmitting light in a blue wavelength range, or the like can be used. Each coloring layer is formed in a desired position with any of various materials by a printing method, an inkjet method, an etching method using a photolithography method, or the like.

The light-blocking layer is provided between the adjacent coloring layers. The light-blocking layer blocks light emitted from an adjacent light-emitting element to prevent color mixture between adjacent light-emitting elements. Here, the coloring layer is provided such that its end portion overlaps with the light-blocking layer, whereby light leakage can be reduced. As the light-blocking layer, a material that can block light from the light-emitting element can be used; for example, a black matrix may be formed using a resin material containing a metal material, pigment, or dye.

Furthermore, an overcoat covering the coloring layer and the light-blocking layer may be provided. The overcoat can prevent an impurity and the like contained in the coloring layer from being diffused into the light-emitting element. The overcoat is formed with a material that transmits light emitted from the light-emitting element; for example, an inorganic insulating film such as a silicon nitride film or a silicon oxide film, an organic insulating film such as an acrylic film or a polyimide film can be used, and further, a stacked structure of an organic insulating film and an inorganic insulating film may be employed.

The light-emitting panels described in this embodiment are planar light sources. Thus, by using each of the light-emitting panels in a light-emitting device, the light-emitting device is less likely to produce a sharp shadow on a photographic subject even when used as a flash. A light-emitting panel of the light-emitting device is less likely to deteriorate when it emits a large amount of light as compared with the case of using a light-emitting diode using an inorganic material. Thus, the light-emitting device can have high reliability. The light-emitting device can be small and thin as compared with the case of using a xenon lamp or the like.

The light emitted from the light-emitting panel of this embodiment has directivity. Thus, the light-emitting panel of this embodiment can be favorably used for a flash of a camera that needs to emit light having directivity in a direction of a photographic subject.

This embodiment can be combined with any of the other embodiments in this specification as appropriate.

Embodiment 8

In this embodiment, a structure of an imaging device of one embodiment of the present invention is described with reference to FIG. 17.

Figure 17:
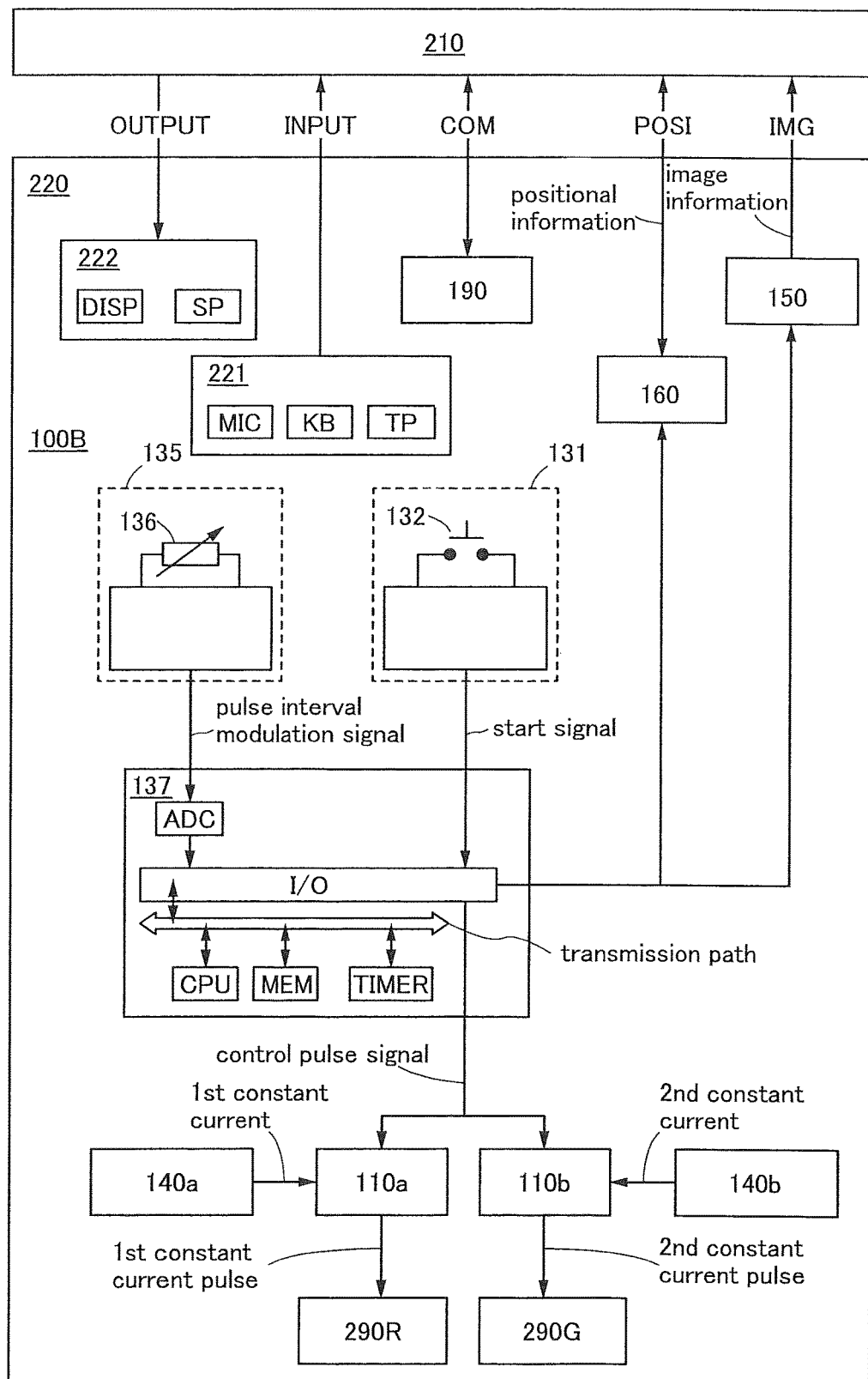
FIG. 17 is a block diagram illustrating a structure of an imaging device according to an embodiment.

FIG. 17 is a block diagram illustrating a structure of an imaging device 200V of one embodiment of the present invention.

<Imaging Device>

The imaging device 200V described in this embodiment includes the arithmetic unit 210 and the input/output unit 220. The input/output unit 220 includes: the imaging unit 150 that is supplied with the shutter signal, performs imaging in an emission direction of pulsed light, and supplies the image information IMG; the above-described light-emitting device 100B that supplies the shutter signal; the positional information acquiring circuit 160; the communication unit 190; the input mechanism 221; and the output mechanism 222 The light-emitting device 100B includes the microcontroller 137 that supplies the shutter signal. Thus, pulsed light with directivity can be emitted, and imaging in an emission direction of the pulsed light can be performed.

Components included in the imaging device 200V are described below.

<<Imaging Unit>>

When light is emitted, the imaging unit 150 performs imaging in an emission direction of light from the first light-emitting module 290R and the second light-emitting module 290G. The imaging unit 150 includes an imaging element and an optical system that forms an image on the imaging element, for example. Specifically, a digital still camera, a digital video camera, or the like can be used. The imaging unit 150 performs imaging when the shutter signal is supplied.

Note that the first light-emitting module 290R and the second light-emitting module 290G can emit light having directivity to a photographic subject. Thus, the imaging unit 150 can take a bright image of the photographic subject. For example, the imaging unit 150 can take a bright image of a distant photographic subject or a photographic subject in a dark place.

<<Arithmetic Unit>>

The arithmetic unit 210 is supplied with the image information IMG, the positional information POSI, and the operation instruction INPUT and supplies the communication information COM and the output information OUTPUT including the display information.

The arithmetic unit 210 includes the arithmetic circuit, the memory unit for storing the program to be executed by the arithmetic circuit, the transmission path, the input/output interface, and the like.

<<Input/Output Unit>>

The light-emitting device of the input/output unit 220 includes the start switch circuit 131 including the switch 132, the microcontroller 137, the first switching circuit 110*a*, the second switching circuit 110*b*, the first light-emitting module 290R, the second light-emitting module 290G, the first constant current supply 140*a*, and the second constant current supply 140*b*.

<<Positional Information Acquiring Circuit>>

The positional information acquiring circuit 160 can be supplied with the shutter signal and can supply the positional information POSI.

The positional information acquiring circuit 160 receives a signal from the Global Positioning System (GPS) and analyzes it to acquire positional information. Note that the positional information includes numerical values of latitude, longitude, and the like.

Alternatively, the positional information acquiring circuit 160 receives a signal from a wireless local area network (LAN) access point whose position is known in advance, and analyzes the kind and the intensity of the signal to acquire positional information.

The positional information acquiring circuit 160 supplies the acquired positional information.

For example, the arithmetic unit 210 may provide the image information WIG to which the positional information POSI is added. The communication unit 190 can be supplied with the image information to which the positional information is added and can transmit the image information to a predetermined address.

<<Input Mechanism>>

A mechanism capable of supplying information to the imaging device 200V can be used as the input mechanism 221.

Examples of a mechanism for supplying the audio information, the operation instruction, or the like are a microphone MIC, a keyboard KB, and a touch panel TP.

Specifically, a user can supply the audio information using the microphone MIC. The arithmetic unit 210 can convert the audio information to an analog signal or a digital signal and supply the converted audio information. The communication unit 190 can supply the converted audio information with or without wire. The communication network can supply the audio information to a remote place, for example.

<<Output Mechanism>>

A mechanism capable of supplying information to a user can be used for the output mechanism 222.

For example, in the case where the output information OUTPUT including the audio information is supplied, the speaker SP can be used for the output mechanism 222. In the case where the output information OUTPUT including the display information is supplied, the display unit DISP can be used for the output mechanism 222.

For example, the display panel including a plurality of display elements arranged in a matrix can be used for the display unit DISP. Specifically, a liquid crystal display panel, an organic EL panel, electronic paper, or the like can be used for the display unit DISP.

This embodiment can be combined with any of the other embodiments in this specification as appropriate.

This application is based on Japanese Patent Application serial no. 2013-194059 filed with Japan Patent Office on Sep. 19, 2013, and Japanese Patent Application serial no. 2013-194056 filed with Japan Patent Office on Sep. 19, 2013, the entire contents of which are hereby incorporated by reference.

What is claimed is:

1. A light-emitting device comprising:
a light-emitting element;
a housing for supporting the light-emitting element; and
an optical component configured to pass light from the light-emitting element through the optical component, wherein the optical component is attachable to and detachable from the housing,
wherein the light-emitting element includes;
a first electrode;
a second electrode overlapping with the first electrode; and
a layer comprising a light-emitting organic compound, between the first electrode and the second electrode, and
wherein the optical component includes:
an attaching member for engaging with the housing, and
an optical sheet for condensing light emitting from the light-emitting element while being attached to the housing using the attaching member.

2. The light-emitting device according to claim 1, wherein the optical sheet includes a planar prism, a Fresnel lens, or a fly-eye lens.

3. The light-emitting device according to claim 1, further comprising:
a switching circuit configured to be supplied with constant current and a control pulse signal and configured to supply a constant current pulse,
wherein the light-emitting element is configured to be supplied with the constant current pulse.

4. The light-emitting device according to claim 1, further comprising:
a sensor circuit configured to sense a state of attachment or detachment of the optical component and supply an attachment/detachment signal; and
a constant current supply configured to be supplied with the attachment/detachment signal and configured to supply constant current whose amount is determined depending on the attachment/detachment signal,
wherein the light-emitting element is configured to be supplied with the constant current.

5. A light-emitting device comprising:
a first switching circuit configured to be supplied with a control pulse signal and a first constant current and configured to supply a first constant current pulse to a first light-emitting element;
a second switching circuit configured to be supplied with a control pulse signal and a second constant current and configured to supply a second constant current pulse to a second light-emitting element; and
a sensor for supplying a sensor signal in accordance with an environment,
wherein the first light-emitting element comprises a first light-emitting organic compound, and the second light-emitting element comprises a second light-emitting organic compound capable of emitting a different color light from the first light-emitting organic compound, and wherein the first constant current and the second constant current are controlled depending upon the sensor signal.

6. An imaging device comprising a light-emitting device according to claim 5.

* * * * *